United States Patent [19]
Dicke et al.

[11] Patent Number: 5,892,406
[45] Date of Patent: Apr. 6, 1999

[54] MIXED SIGNAL PHASE LOCKED LOOP WITH PROCESS AND TEMPERATURE CALIBRATION

[75] Inventors: Curtis J. Dicke, Colorado Springs, Colo.; Jack Wolosewicz, Boston, Mass.

[73] Assignee: Quality Semiconductor, Inc., Santa Clara, Calif.

[21] Appl. No.: 735,851

[22] Filed: Oct. 23, 1996

[51] Int. Cl.[6] .............................. H03L 7/099; H03L 7/10
[52] U.S. Cl. .............................. 331/40; 331/16; 331/17; 331/25; 331/34; 331/57; 331/DIG. 2
[58] Field of Search .................................. 331/10, 16, 17, 331/25, 34, 57, DIG. 2

[56] References Cited

U.S. PATENT DOCUMENTS

| 5,075,640 | 12/1991 | Miyazawa | 331/10 |
| 5,212,601 | 5/1993 | Wilson | 360/51 |
| 5,315,271 | 5/1994 | Pascual et al. | 331/57 |
| 5,663,991 | 9/1997 | Kelkar et al. | 375/376 |

*Primary Examiner*—Siegfried H. Grimm
*Attorney, Agent, or Firm*—Pennie & Edmonds LLP

[57] ABSTRACT

A mixed signal phase locked loop is optimized for fast settling and low noise sensitivity. To this end, this device has a digital wide range delay line and a low gain per stage adjust. When first activated, the loop calibrates the digital delay line to its nominal delay characteristic. This delay line, together with the linear low gain per stage adjust, constitutes the internal oscillator of the phase locked loop. After achieving nominal delay, the oscillator uses the low gain per stage adjust to lock to a desired reference or a submultiple thereof. According to the preferred embodiment, the loop locks its internal 125 MHz oscillator to a 25 MHz reference. After achieving lock, the loop performs synchronous data recovery by locking to an incoming data stream, instead of the internal reference, and performing bit framing. In case of losing lock, the phase locked loop of the present invention is capable of recalibrating itself and regaining lock in under 3 microseconds.

18 Claims, 31 Drawing Sheets

MIXED SIGNAL PHASE LOCKED LOOP WITH PROCESS AND TEMPERATURE CALIBRATION

FIELD OF THE INVENTION

The present invention relates generally to signal processing circuits for communications and control and, more particularly, to mixed signal phase locked loops.

BACKGROUND OF THE INVENTION

Conventional phase locked loops are generally ineffective in taking process and temperature effects into consideration during loop calibration. Thus, to achieve nominal conditions, large errors must be tuned out of the loop. These phase locked loops employ analog adjustments with high gains typically on the order of 100 to 200 Mhz per volt to dial out such errors. Undesirably resulting from such high gain adjustments, these phase locked loops typically suffer slow settling times and high noise sensitivity.

SUMMARY OF THE INVENTION

It is an object of the present invention to measure how process, temperature and other operating conditions affect delay characteristics of the phase locked loop.

This and other objects of the present invention are achieved by an apparatus and method for calibrating a delay line. A reference delay line consisting of a plurality of delay elements (typically inverters) connected in series is utilized. The delay elements have set and reset lines. The set lines of each of the delay elements are connected to the reset lines of each of the preceding delay elements in the reference line. A clock circuit generates a clock pulse of known duration. This clock pulse is propagated through the reference delay line. As the clock pulse propagates through the reference line, successive delay elements are set. This remains true until the clock pulse times out. Advantageously, because the set lines of each of the delay elements are connected to the reset lines of each of the preceding delay elements, as each successive delay element is set, the preceding delay elements in the reference line are reset. Calibration results in a single delay element asserting its output representing the delay characteristics of the loop.

It is a further object of the present invention to generate an internal oscillator which accurately compensates for process, temperature and other operating effects on delay characteristics.

This and other objects of the present invention are achieved by a method and apparatus which receive a signal indicative of the delay appropriate to generate one-half of the desired clock cycle. This signal, or some multiple or submultiple thereof, is generated according to the calibration apparatus and method described above. The oscillator includes a plurality of loops. Each of these loops consists of a delay line having an inverter and a delay of varying length. A selection circuit selects the loop having a delay corresponding to the amount of delay appropriate to generate one-half of a clock cycle. An intentional offset is built into the loop. A low gain analog adjustment is applied to the internal oscillator to bring the oscillator in lock with a reference clock.

It is a further object of the present invention to avoid the difficulty of instantaneous correlation of incoming data to the internal clock.

This and other objects of the present invention are achieved by anticipating the presence of incoming data. A detection circuit detects the presence of valid data. When valid data is detected, the detection circuit sends a signal to enable a comparator. The data signal is then applied to a first delay circuit. The first delay circuit sends a delayed version of the data to the comparator for comparison with the clock signal. The data is then applied to a second delay circuit. The second delay circuit sends a signal to disable or turn off the comparator.

It is another object of the invention to detect for lock by simulating maximum and minimum analog delay stub settings.

This and other objects of the invention are achieved by a first delay circuit which skews a first signal in a first direction with respect to a second signal. A second delay circuit skews the first signal in a second direction with respect to the second signal. A comparison circuit compares an edge of the second signal with the corresponding edge of the first signal skewed in the first direction. A second comparison circuit compares the edge of the second signal with the corresponding edge of the first signal skewed in the second direction. Phase lock is determined from the results of the comparisons. Advantageously, the circuit used to detect lock on reference may also be used to detect lock on data.

BRIEF DESCRIPTION OF THE DRAWINGS

These and other features, aspects and advantages of the present invention will become better understood with reference to the following description, appended claims, and drawings where

DETAILED DESCRIPTION OF PREFERRED EMBODIMENT

The architecture of the phase locked loop of the present invention is optimized for fast settling and low noise sensitivity. To this end, this device has a digital wide range delay line and a very low gain per stage adjust.

When first activated, the loop calibrates the digital delay line to its nominal delay characteristic. This delay line, together with the low gain per stage adjust, constitutes the internal oscillator of the phase locked loop. After achieving nominal delay, the oscillator uses the low gain adjustment to lock to a desired reference or a submultiple thereof. According to the preferred embodiment, the loop locks its internal 125 MHz oscillator to a 25 MHz reference.

After achieving lock, the loop performs synchronous data recovery by locking to an incoming data stream, instead of the internal reference, and performing bit framing. In case of losing lock, the phase locked loop of the present invention is capable of recalibrating itself and regaining lock in under 3 microseconds.

Figure 1:
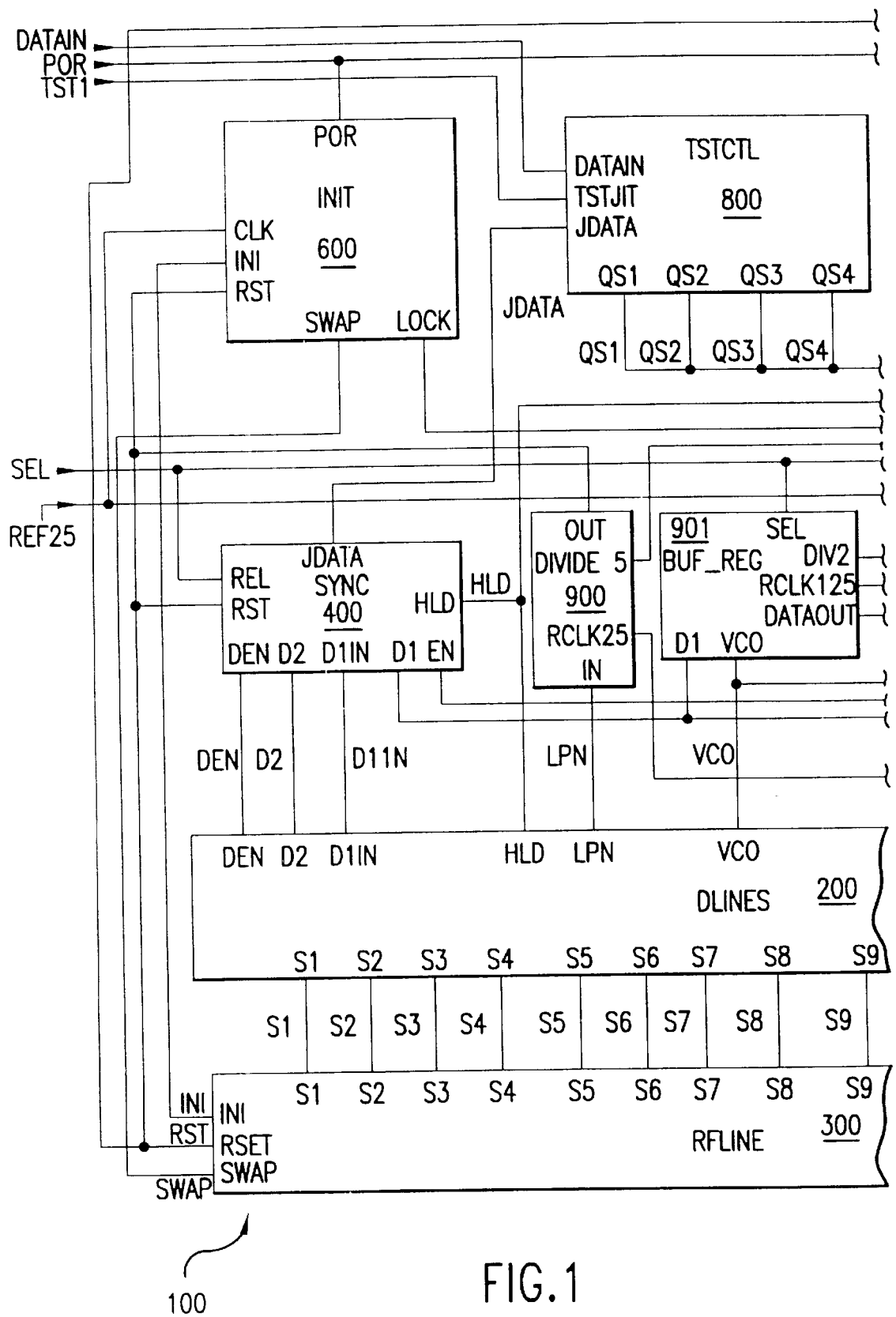
FIGS. 1 and 1a illustrate schematically a mixed signal phase locked loop in accordance with a preferred embodiment of the present invention.
Figure 1A:
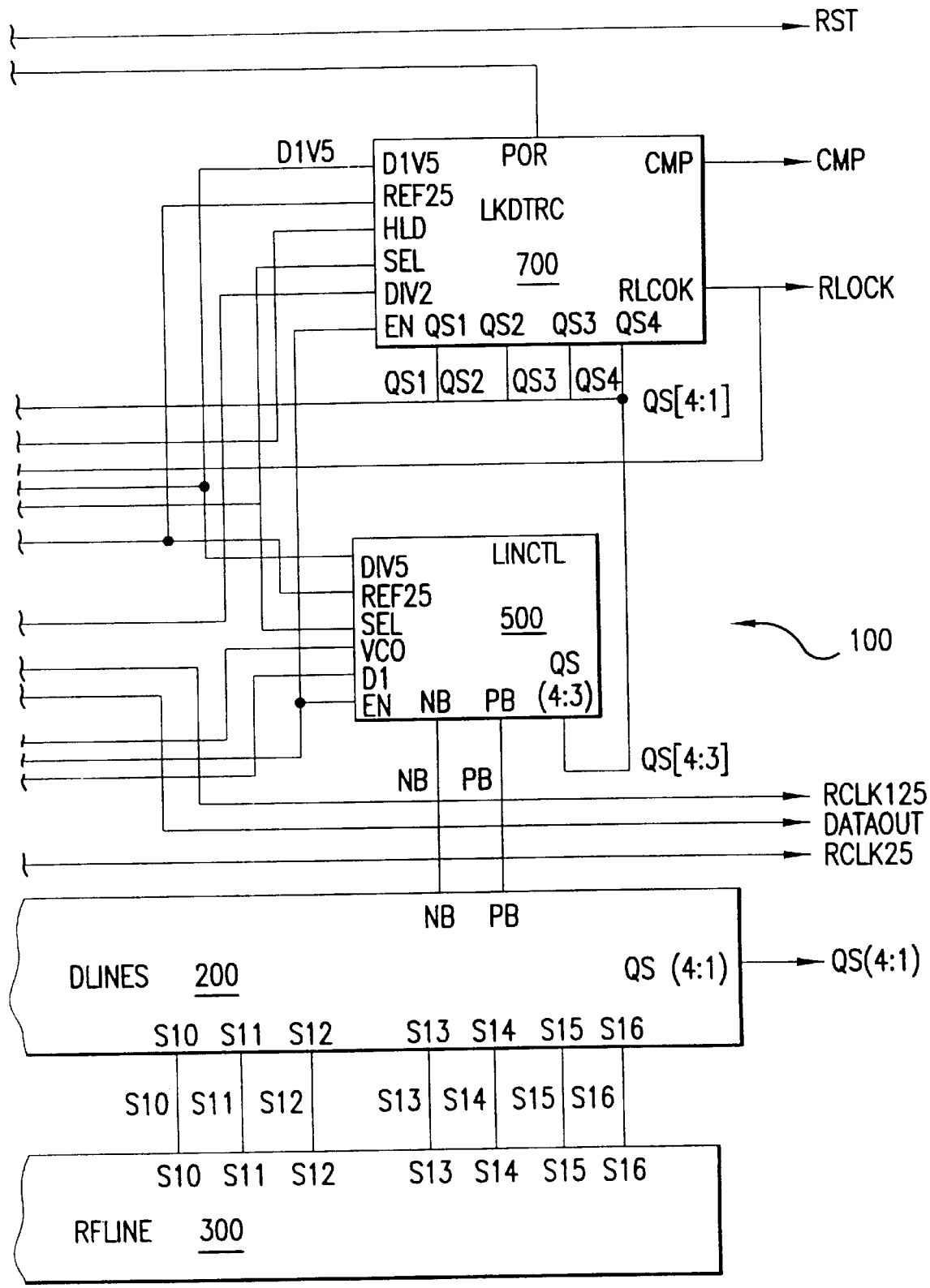

FIGS. 1 and 1a illustrate schematically the circuit diagram of the mixed signal phase locked loop 100 according to the present invention. The mixed signal phase locked loop 100 includes an oscillator and bit framing delay lines circuit (sometimes referred to as "DLINES") 200, a reference delay circuit (sometimes referred to as "RLINE") 300, a synchronization circuit (sometimes referred to as "SYNC") 400, a phase frequency comparator (sometimes referred to as "LINCTL") 500, an initialization circuit (sometimes referred to as "INIT") 600, a lock detect circuit (sometimes referred to as "LKDTRC") 700, jitter tolerance test circuit (sometimes referred to as "TSTCTL") 800, a divide 5 circuit (sometimes referred to as "DIV5") 900, and buffer circuit (sometimes referred to as "BUF_REG") 901.

OSCILLATOR AND BIT FRAMING DELAY LINE

The oscillator and bit framing delay line circuit 200 is illustrated in FIGS. 2, 2a, 2b, 2c, and 2d. The oscillatory and bit framing delay block 200 performs two primary functions: internal oscillator generation and bit framing.

Internal oscillator generation

Oscillator clock signal generation uses process and temperature positioning to generate a clock cycling at a desired reference or a submultiple thereof. In the preferred embodiment, the internal oscillator cycling at 125 MHz locks to a 25 MHz reference. Internal oscillator generation is achieved primarily by LOOPFE 201c and four STG4LP blocks 202c, 203c, 204c, 205c.

Figure 2:
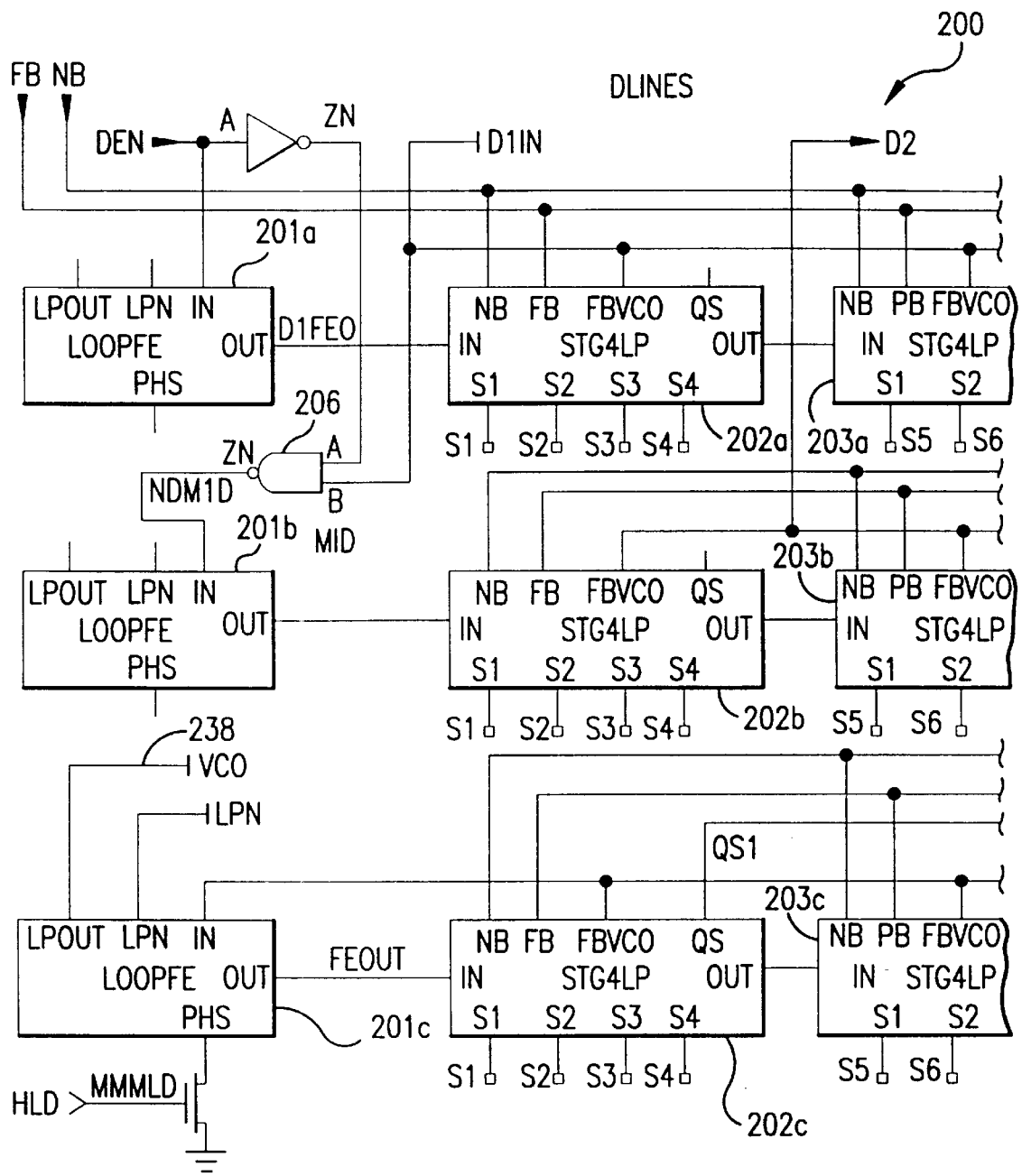
FIGS. 2, 2a, 2b, 2c and 2d illustrate schematically an oscillator and bit framing delay lines circuit of the phase locked loop of FIG. 1.
Figure 2A:
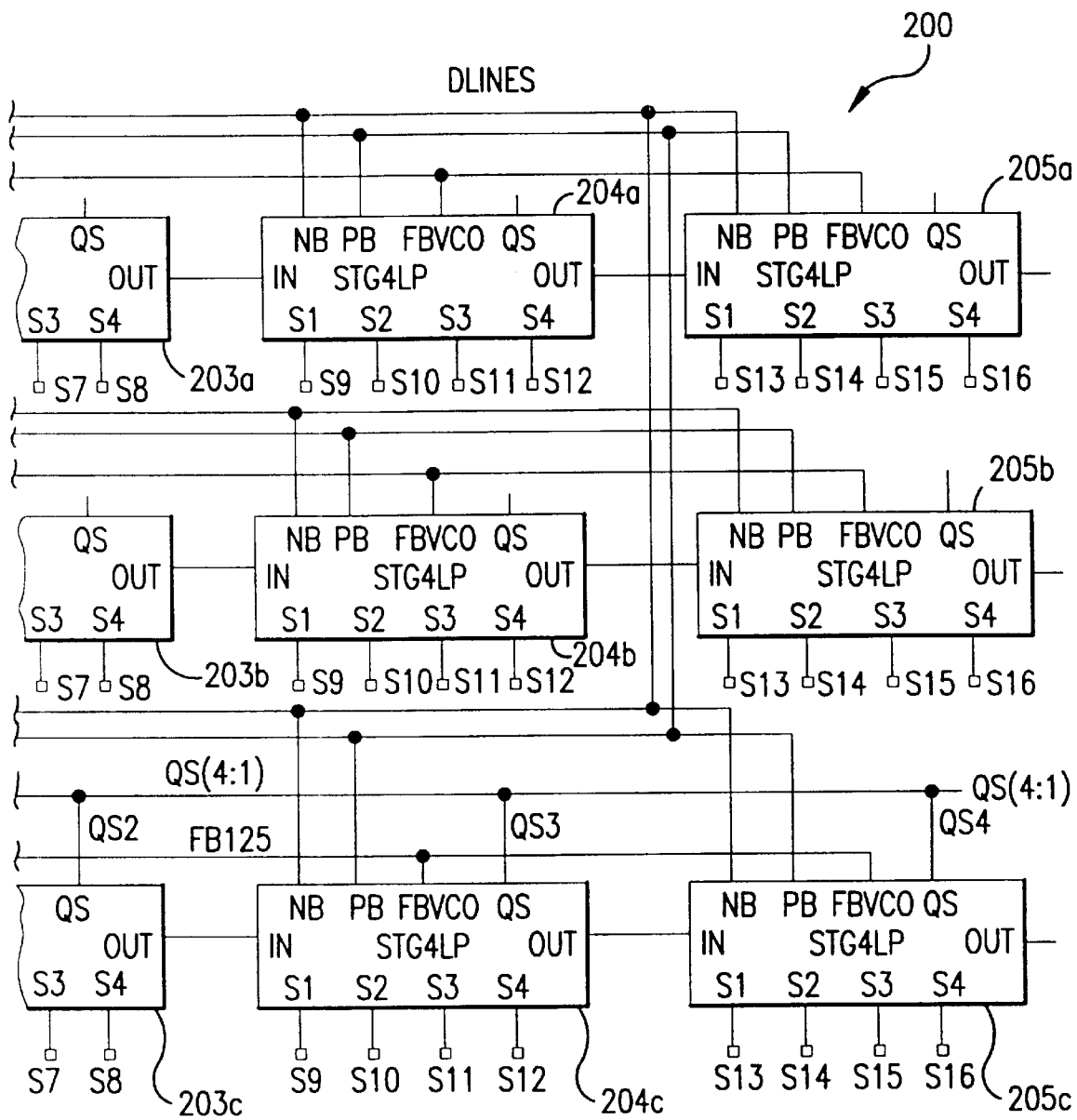
Figure 2B:
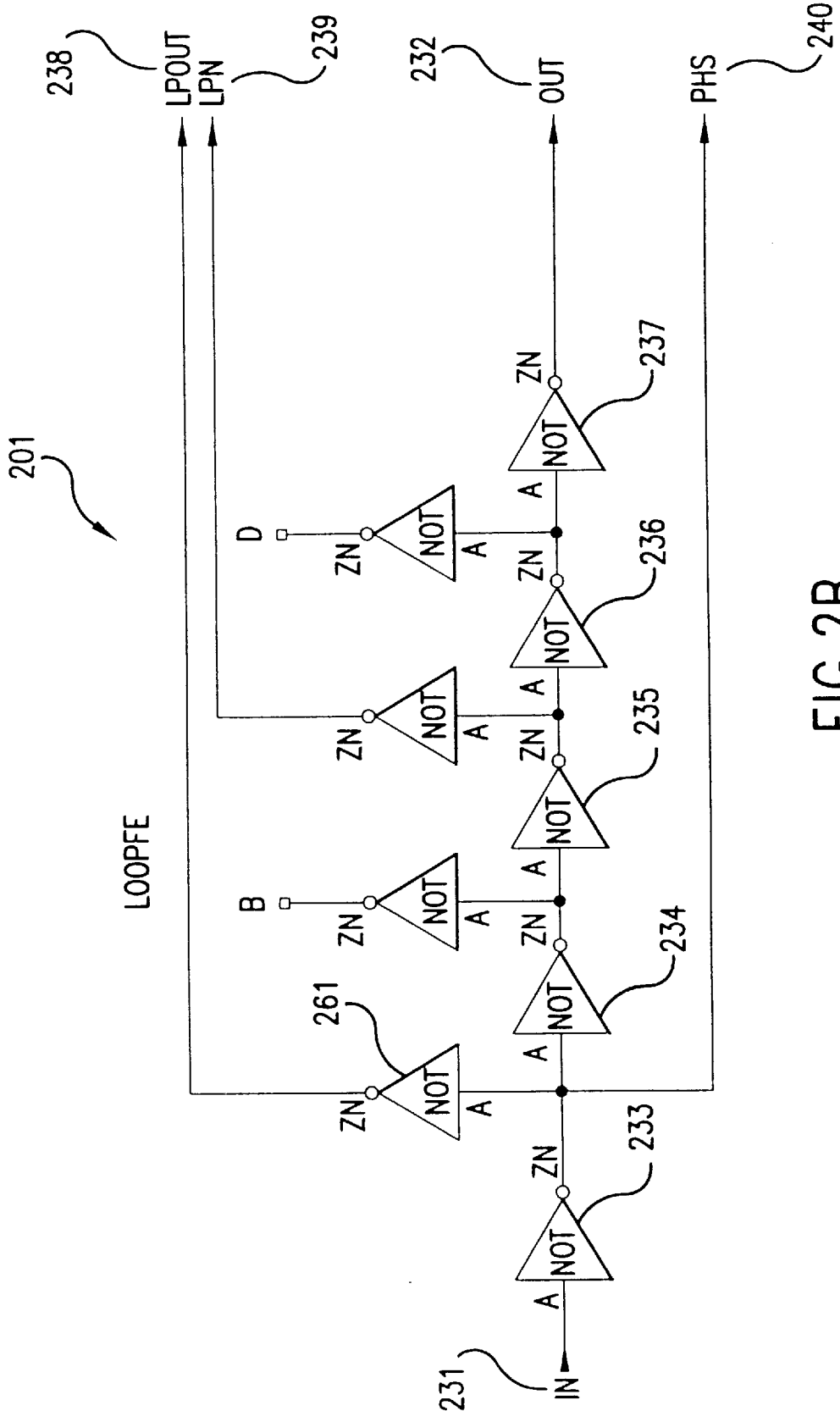

LOOPFE 201 is illustrated in FIG. 2b. LOOPFE 201 is designed primarily to invert and delay the internal oscillator clock signal. As illustrated in FIG. 2b, LOOPFE 201 comprises an input signal line IN 231, an output signal line OUT 232, a plurality of delay elements (inverters) connected in series 233–237, and a plurality of additional lines LPOUT 238, LPN 239, and PHS 240 tapped either directly or indirectly through an inverter along the delay line. The oscillator clock signal on IN 231 passes through a plurality of inverters odd in number. Thus, the delayed oscillator clock signal is inverted. In accordance with the preferred embodiment, the oscillatory clock signal passes through five (5) inverters.

A STG4LP block is illustrated in FIGS. 2, 2a, 2c and 2d. Depending on the process and temperature positioning indicated by the S1–S16 outputs from RFLINE (described below), successive STG4LP blocks 202c, 203c, 204c, 205c will either pass through the internal oscillator signal to the next STG4LP after adding an additional delay or will feedback the signal through FBVCO 241 to LOOPFE 201. Additionally, an analog adjustment is applied to the internal oscillator clock signal in each STG4LP blocks 202c, 203c, 204c, and 205c by bias voltages generated as a result of the phase-frequency comparator in LINCTL comparing the internal oscillator signal to the reference signal. Advantageously, a 125 MHz process and temperature compensated reference oscillator locked to a reference oscillator is achieved.

As described in greater detail below, upon activation or loss of lock condition indicated by RSET, RFLINE is calibrated. Using the 25 MHz reference clock signal, calibration entails sending a 20 nanosecond clock pulse down a reference line (one half cycle of the 25 MHz reference clock). One of the sixteen S1–S16 outputs from RFLINE is asserted to indicate through how many RFLINE delay elements in the reference line the clock pulse travelled before timing out. This is a measure of how temperature and process considerations affect nominal delay characteristics.

Desirably, this information is utilized by DLINES 200 to establish the 125 MHz internal oscillator clock signal. The number of delay elements through which the 20 nanosecond clock pulse (one half duty cycle of 25 MHz reference clock) travelled in RFLINE is determined in calibration. Because a 125 MHz internal oscillator clock signal is desired, there exists a 5 to 1 ratio of RFLINE to DLINES 200 delay characteristics. More specifically, for every five (5) delay elements employed in RFLINE, there is approximately one corresponding delay element employed in DLINES 200. This achieves the desired multiplication of the 25 MHz clock signal used for RFLINE calibration to the internal oscillator signal of DLINES 200 (targeted to cycle at 125 MHz). Thus, a four nanosecond half-duty cycle is achieved. (There is not a perfect 5:1 mapping because there are some parasitics in some of the other stages that act as an equivalent to the delay elements.)

An intentional negative offset is incorporated into the reference delay line at RFFE. This offset is approximately matched 5:1 in the delay line at LOOPFE. This offset in the oscillator loop is intentionally included in DLINES so that the oscillator clock signal is initially set up to run approximately five percent (5%) faster than the target frequency— that is, the period is less than 8 nanoseconds.

Figure 2C:
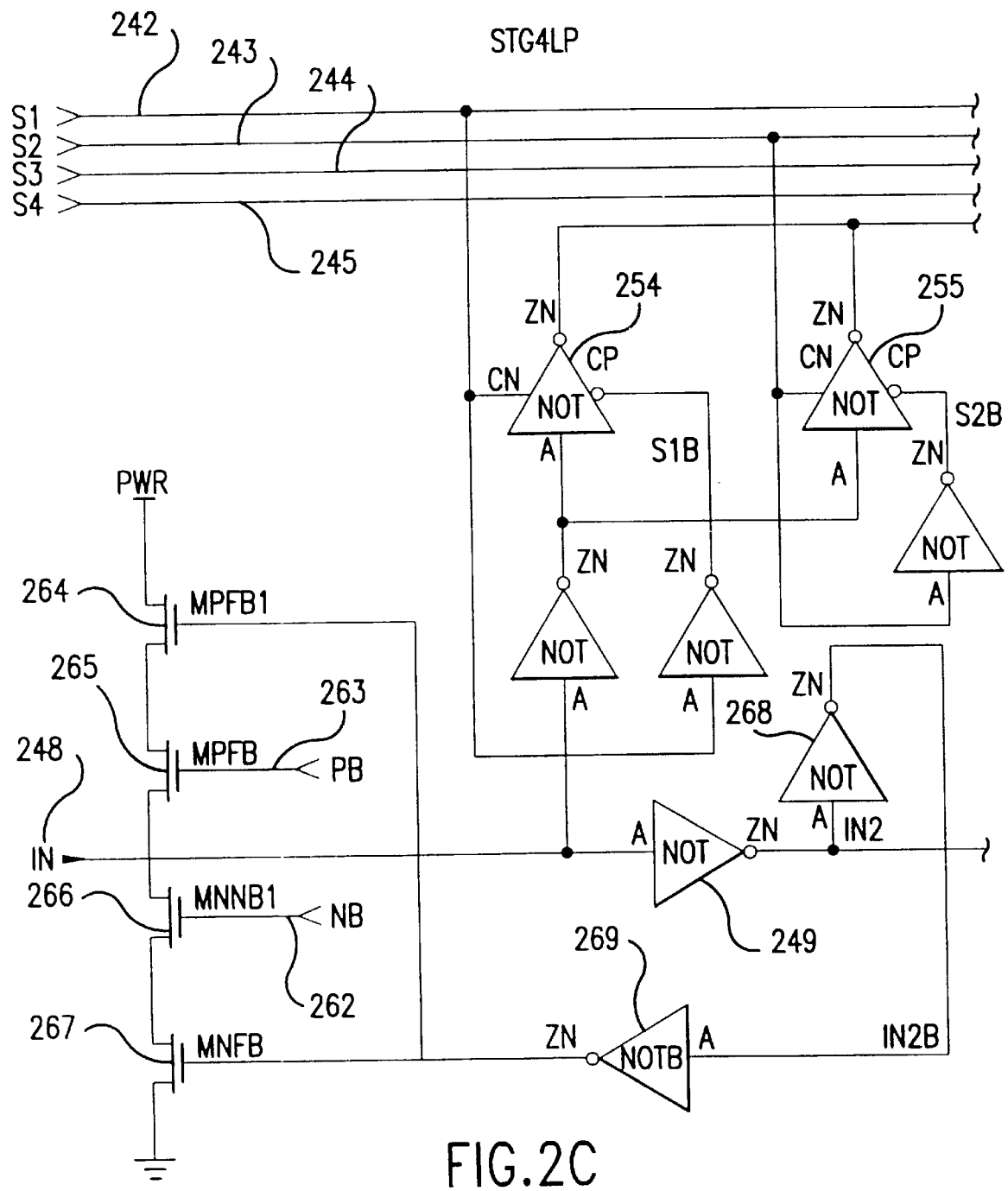
Figure 2D:
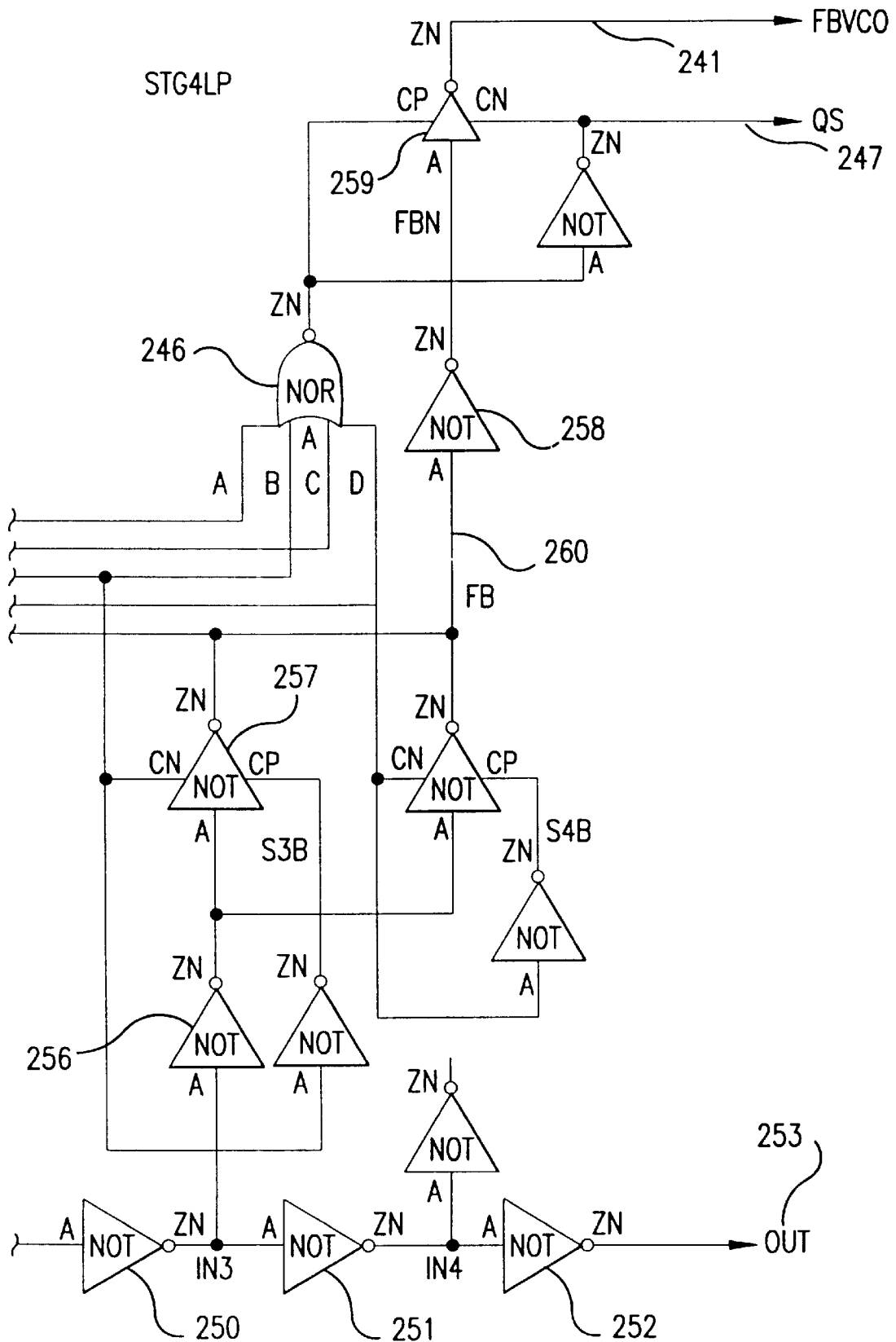

As illustrated in FIG. 2c and 2d, each of the STG4LP blocks 202, 203, 204, 205 includes four select lines S1 242, S2 243, S3 244, and S4 245 connected to one of the sixteen (16) corresponding S outputs from RFLINES. Select lines S1 242, S2 243, S3 244, and S4 245 of the first STG4LP block 202c are connected to the S1–S4 outputs from RFLINE; S1, S2, S3 and S4 of the second STG4LP block 203c are connected to S5–S8 outputs from RFLINE; S1, S2, S3 and S4 of the third STG4LP block 204c are connected to S9–S12 outputs from RFLINE; and S1, S2, S3 and S4 of the fourth STG4LP block 204c are connected to S13–S16 outputs from RFLINE. In each STG4LP block 202c–205c, NOR gate 246 generates signal QS 247. These QS signals 247 are cruder estimates of the process and temperature positioning indicated by the S outputs from RFLINE.

After the internal oscillator clock signal leaves LOOPFE 201, it enters the first STG4LP block 202c at input line IN 248. If none of S outputs from RFLINE corresponding to the S1, S2, S3 or S4 select lines of the first STG4LP block 202c is asserted, the clock signal will pass through inverters 249, 250, 251, and 252, exit through output line 253 and continue onto the second STG4LP 203c. The internal oscillator clock signal will continue passing through successive STG4LP blocks 204c and 205c until it encounters the select line corresponding to the asserted S output from RFLINE. Upon encountering the select line corresponding to the asserted S output from RFLINE, the internal oscillator clock signal is fed back to LOOPFE 201 through FBVCO 241. The loop is approximately 4 nanoseconds, one-half the duty cycle of a 125 MHz clock.

An analog adjustment is applied to the internal oscillator clock signal by bias voltages to tune the 5% offset out of the oscillator loop and bring the internal oscillator in lock with the reference clock. The bias voltages are designated NB 262 and PB 263. As described in greater detail below, NB 262 and PB 263 are generated in LINCTL as a result of the phase-frequency comparison of the 25 MHz reference clock and the 125 MHz internal oscillator VCO 238 established in DLINES 200 after passing through DIV5 900.

These bias voltages effectively control the load that the signal appearing at IN 248 encounters. They affect the rise and fall times of the signal. In essence, these bias voltages either make it harder or easier for the signal to switch values. If the bias voltages make it harder for the signal to switch values (i.e., increase the rise time of the signal), the internal oscillator clock signal will slow. Alternatively, if the bias voltages make it easier for the signal to switch values (i.e., decrease the rise time of the signal), the speed of the internal oscillator will increase.

NB 262 and PB 263 are applied to a circuit formed by the two p-channel transistors 264 and 265 connected in series between the power supply voltage and IN 248, two n-channel transistors 266 and 267 connected in series between IN 248 and ground, and inverters 249, 268 and 269.

In the present invention, because of accuracy of setting the digital wide range delay line, bias voltages related to noise or jitter advantageously need have less of an effect on the total loop. Thus, very low gain delay adjustment is employed. The gain in the present invention is approximately 8–14 Mhz per volt as compared to 100 Mhz per volt typically found in prior art phase locked loops. Jitter being an important criteria of stability of a phase locked loop, the present invention achieves extremely low jitter in the presence of noise. The present invention achieves approximately a factor of 10 less jitter for the same amount of noise on PB and NB because the gain is so low.

Bit framing

Bit framing 201a and 201b relate generally to the synchronization of the internal oscillator clock signal to incoming data. The present invention is designed to recover an incoming data signal transmitted at 125 megabits. It is well understood that the present invention is effective at other frequencies. In accordance with the present invention, DLINES maps the 125 MHz internal oscillator to the incoming data signal. Phase cancellation and the dynamic response are addressed.

Generally speaking, bit framing processes a falling edge of incoming data and correlates its phase error relative to the internal clock. The present invention advantageously anticipates the presence of incoming data, thereby avoiding the difficulty of instantaneous correlation of incoming data to the internal clock. When valid incoming data is anticipated, a sample window is created allowing definition of a point of time where this error may be determined. The phase error is then eliminated by averaging. Thus, a recovered clock that is timed relative to incoming data is achieved.

Bit framing also takes advantage of process and temperature positioning used to generate the 125 MHz oscillator. In the same fashion as described above, bit framing in DLINES is achieved with a first 4 nanosecond delay segment and a second 4 nanosecond delay segment. The first 4 nanosecond delay segment comprises LOOPFE 201a and STG4LP 202a, 203a, 204a, and 205a and is tapped after the 4 nanosecond delay. As illustrated on FIGS. 2 and 2a, this center tap is designated D1IN. The second 4 nanosecond delay segment comprises LOOPFE 201b and STG4LP 202b, 203b, 204b and 205b. The second delay segment is end tapped. The end tap is designated D2. As described in greater detail below, the SYNC provides enabled data to DLINES on DEN. The enabled data on DEN enters the first 4 nanosecond segment at the IN input to LOOPFE 201a. The enabled data passes through STG4LP 202a–205a. In a manner described above in connection with oscillator generation, the enabled data will time out from one of the first four STG4LP blocks 202a–205a at 4 nanoseconds as D1IN and will time out from the second four STG4LP blocks 202c–205c at 8 nanoseconds as D2.

Bit framing processes a falling edge of a version of D1IN and correlates its phase error relative to the internal clock. Because D1IN is a delayed version of DEN, the present invention avoids the difficulty of instantaneous correlation of incoming data to the internal clock. As described below, SYNC uses D2 to create the 8 nanosecond second enable window to define a point of time where phase error may be determined.

REFERENCE DELAY CIRCUIT

The reference delay circuit 300 includes a reference delay line nominally designed for a ½ reference clock (CLK) delay. Upon activation or loss of lock condition indicated by the RSET 306 and followed by the INI 307 inputs from the INIT block, a single CLK pulse, INI 307, is set down this line. According to the illustrated embodiment, INI is a 20 nanosecond clock pulse. RFLINE 300 asserts one of its S1–S16 outputs to indicate how far down the reference line the INI signal traveled before timing out. This process measures how far reference delay characteristics are from the nominal delay characteristics.

Figure 3:
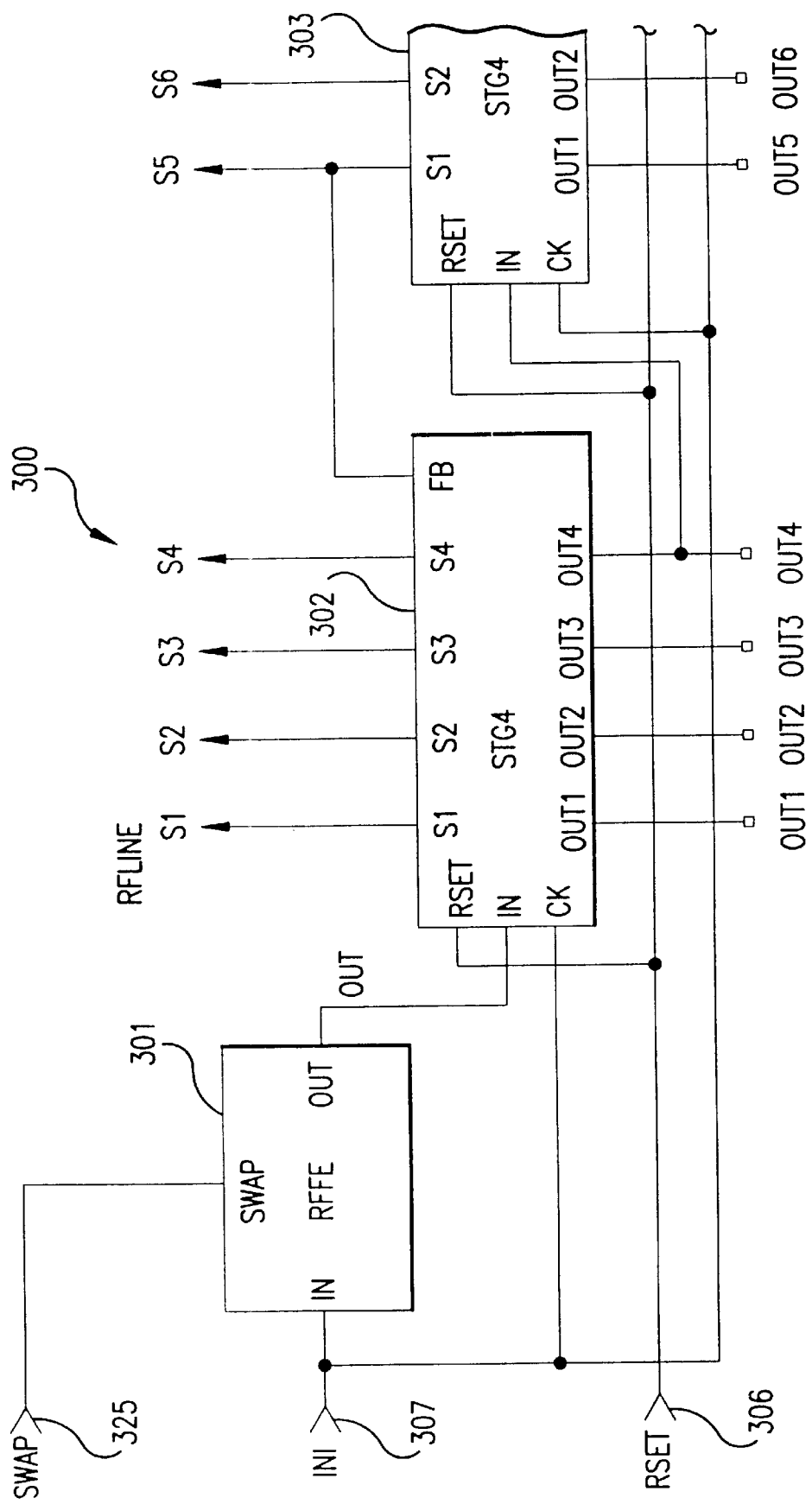
FIGS. 3, 3a, 3b, 3c, 3d and 3e illustrate schematically a reference delay circuit of the phase locked loop of FIG. 1.
Figure 3A:
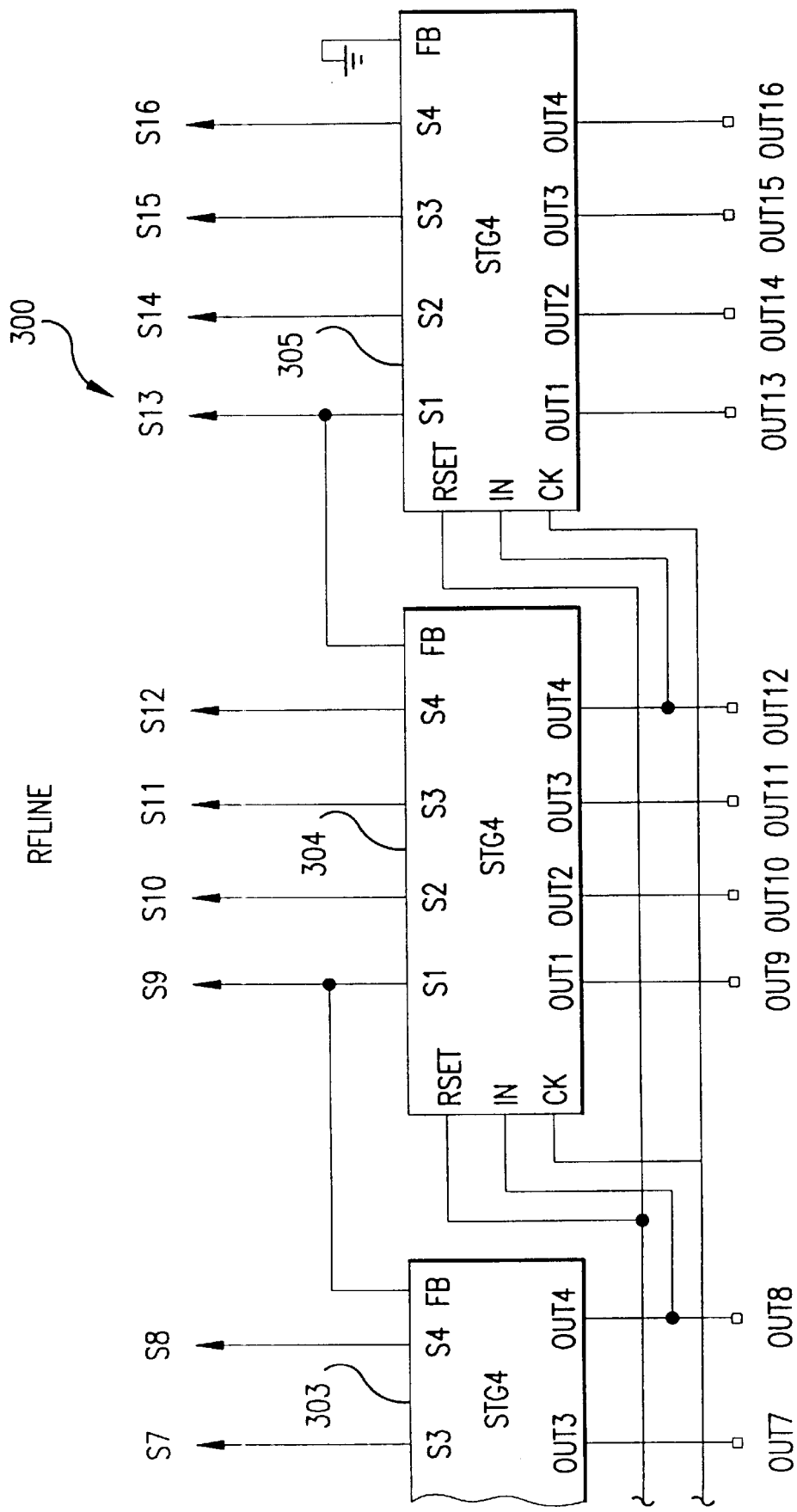

Referring now to FIG. 3 and 3a, a reference delay circuit 300 is illustrated in accordance with the present invention. Reference delay circuit 300 includes a reference delay element 301 and four STG4 302, 303, 304 and 305.

Figure 3B:
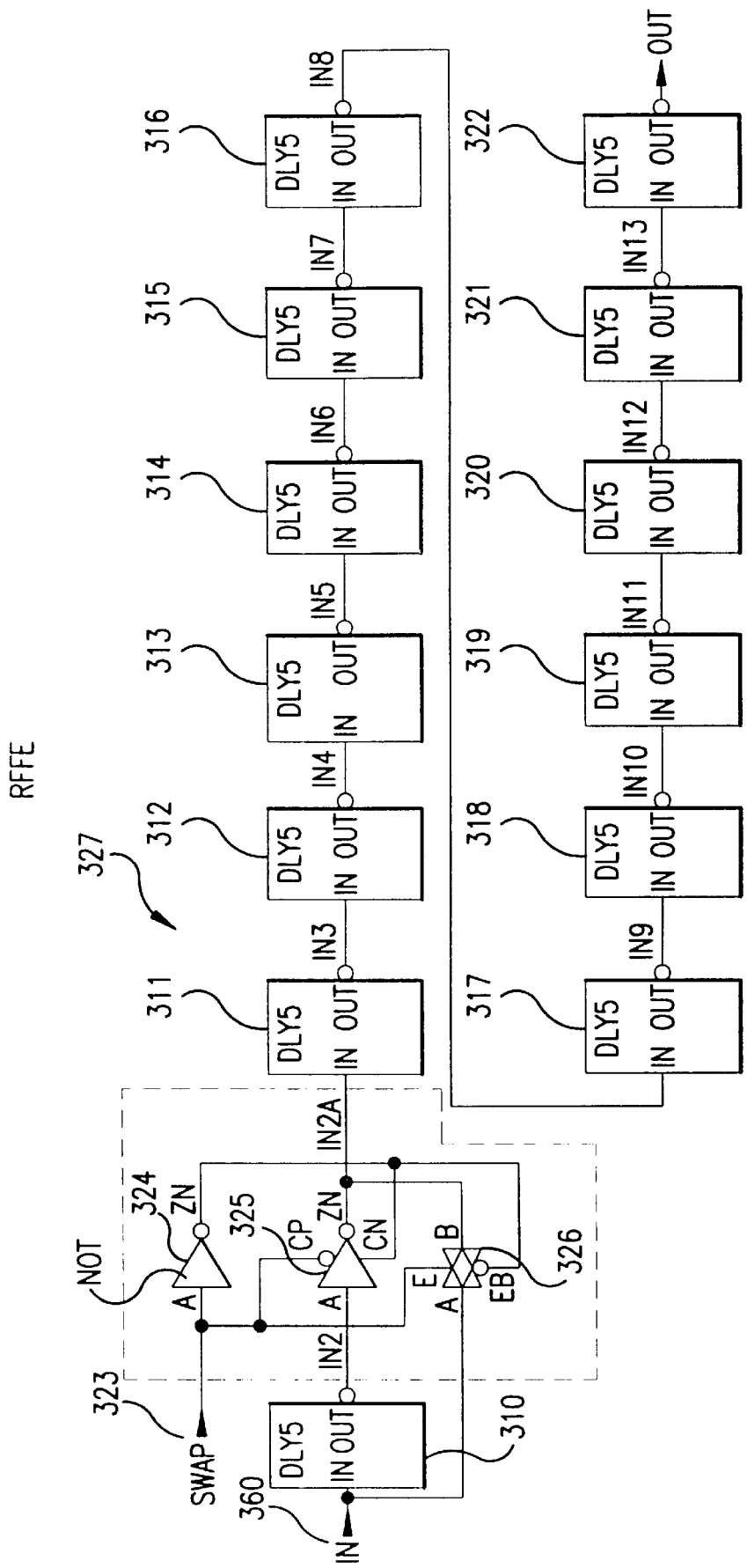

Illustrated in FIG. 3b, reference delay element 301 is designed to impose a reference delay on the signal INI 307 received from the INIT circuit. Reference delay element 301 comprises a plurality of delay elements 310–322 connected in series and a swap circuit 327. Reference delay element 301 receives INI 307 as an input. By means of delay elements 310–322, reference delay element 301 imparts a delay on the received INI 307 input signal.

The swap circuit 327 allows the timing circuit to adjust the amount of delay in the reference delay line. Swap circuit 327 comprises inverter 324, tri-state inverter 325, and transmission gate 326. When SWAP 323 is a logical "1", transmission gate 326 is "on", thereby allowing INI 307 input signal to skip the first delay device 310. When SWAP 323 is a logical "0", transmission gate 326 is "off", thereby forcing the INI 307 input signal through the first delay device 310 and tri-state inverter 325. SWAP 323 signal is received from the INIT circuit.

Figure 3C:
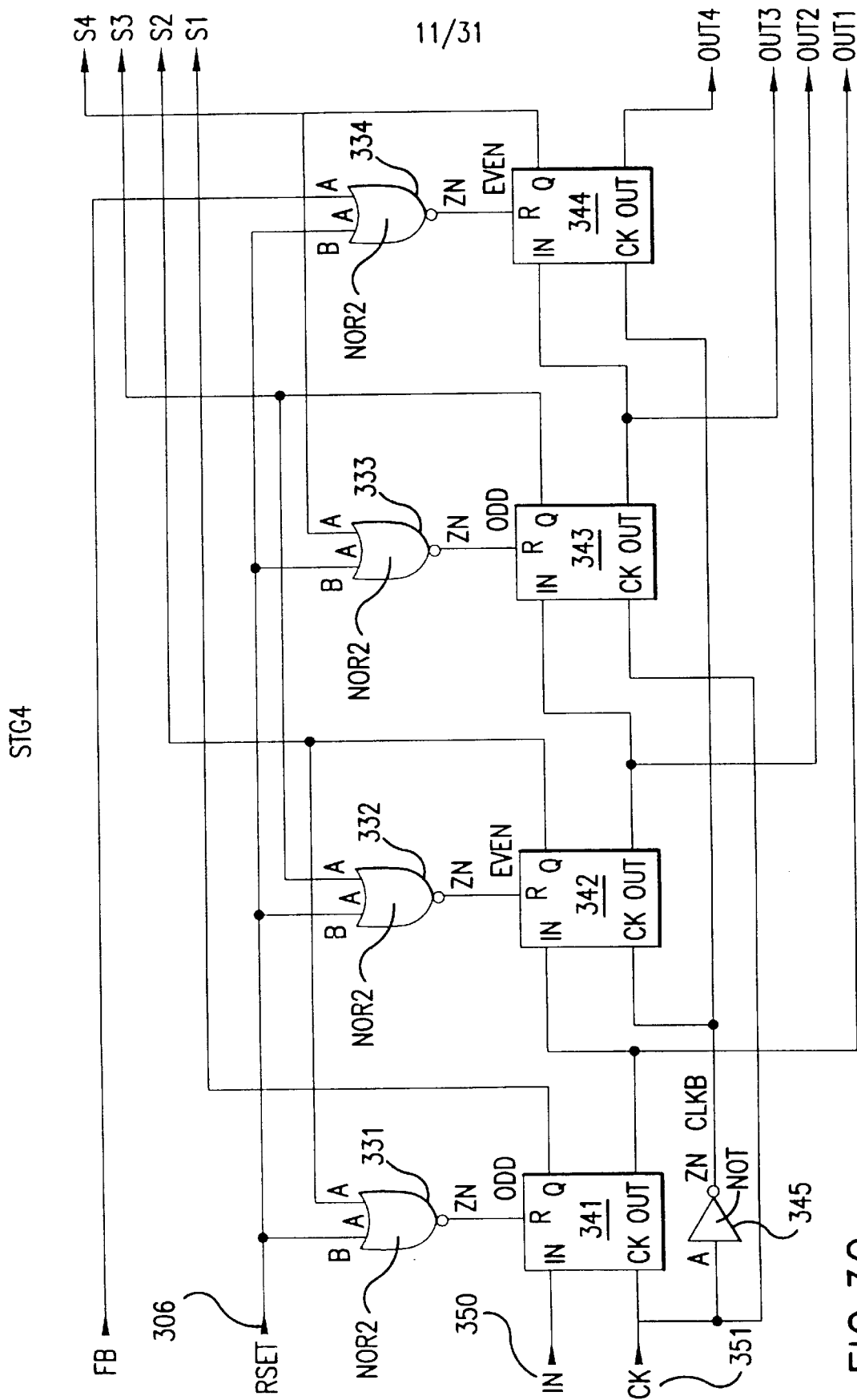
Figure 3D:
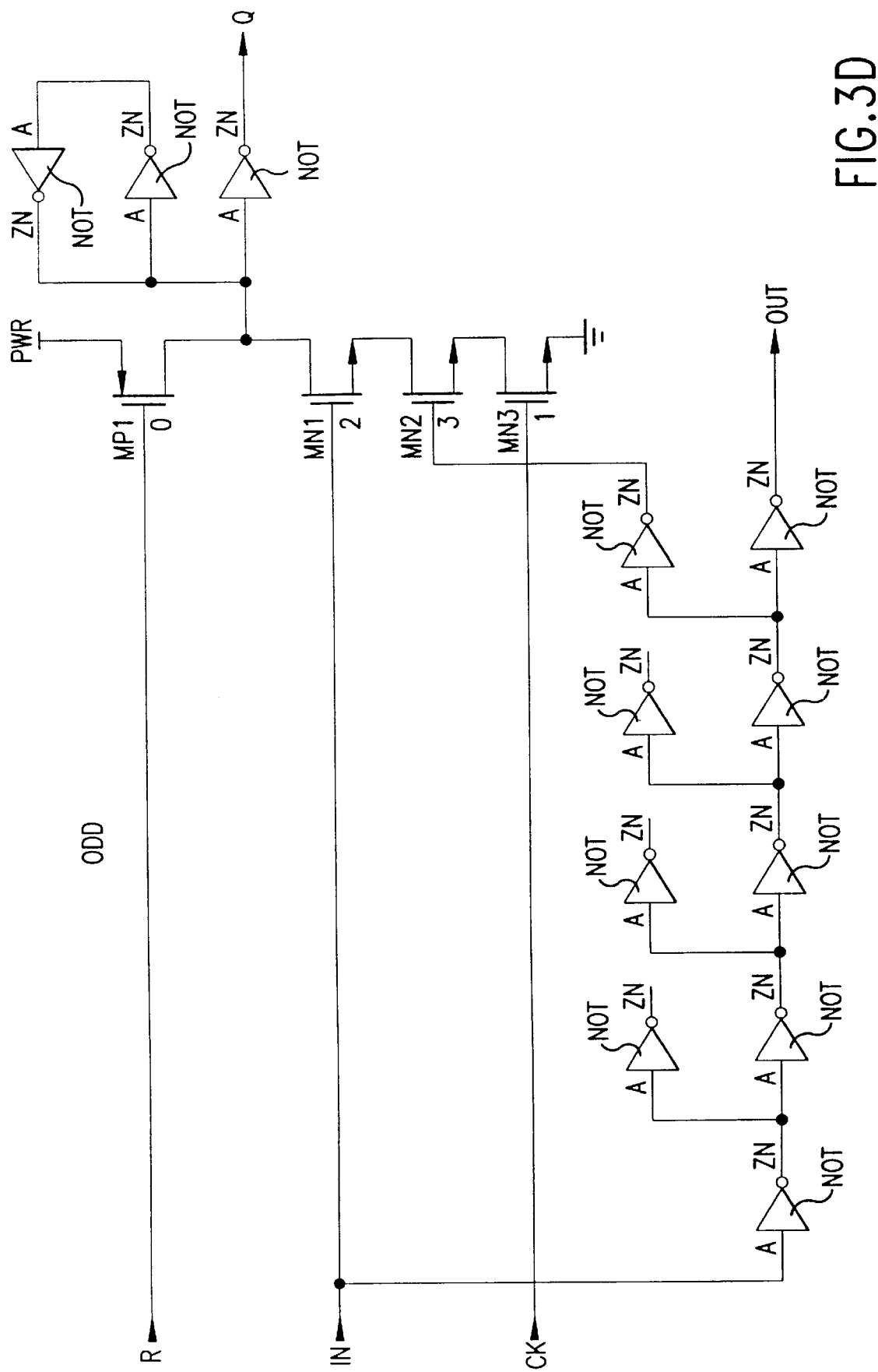
Figure 3E:
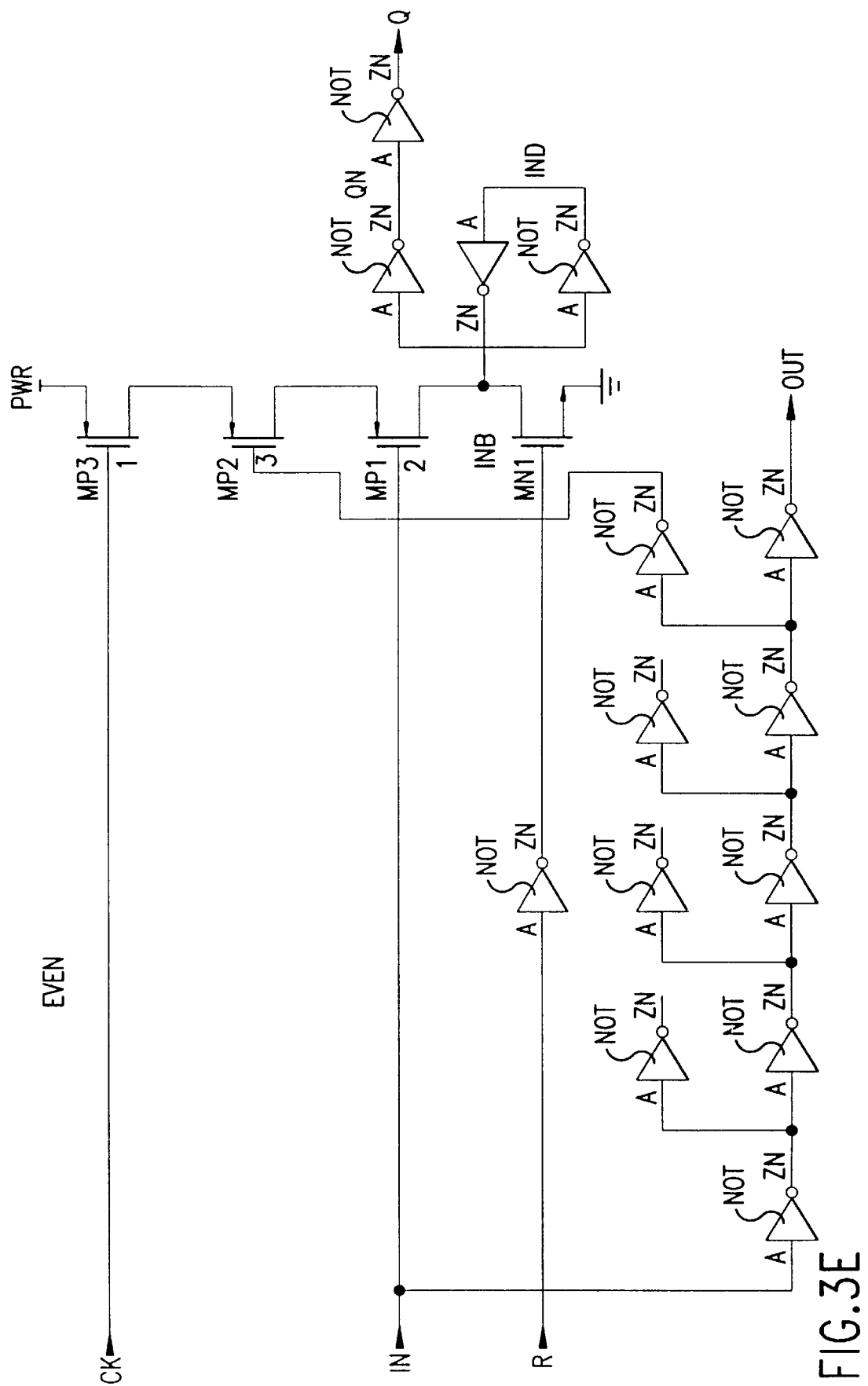

Four STG4 302, 303, 304, and 305 are designed to measure how far the reference delay characteristics are from the nominal delay characteristics. As illustrated in FIG. 3c, each of the STG4 blocks comprise four NOR gates 331, 332, 333, and 334, two odd delay stages 341 and 343 and two even delay stages 342, and 344, and an inverter 345. FIGS. 3d and 3e illustrate odd and even delay stages, respectively. The delay stages can be thought of as a plurality of level sensitive latches connected in series. Each delay stage is designed to receive as an input the original INI pulse 307 from the INIT circuit (CK) 351 and the delayed INI pulse 307 delayed by the reference delay element and the previous delay stages along the reference delay line.

As the INI pulse 307 propagates through the reference line, successive delay stages assert their respective S outputs. This will continue until the INI pulse 307 times out. As illustrated in FIG. 3c, the Q output of each delay stage is applied through a NOR gate to the reset of each of the preceding delay stages. Advantageously, because of this design, as each successive delay element is set, the preceding delay elements in the reference line are reset. Only the last delay stage through which the INI pulse 307 propagated prior to timing out will remain asserted.

This calibrates RFLINE 300 which asserts one of its S1–S16 outputs. The S outputs indicate how far down the reference line the CLK signal traveled before timing out. This process measures how far reference delay characteristics are from the nominal delay characteristics (nominal is defined as approximately half-way down the reference line or $(S_1-S_{16})/2=S_8$).

SYNC 400

SYNC 400 provides synchronization and data valid signals to DLINES and LINCTL. The inputs to SYNC 400 are RST 401—initialization pulse from INIT block; SEL 402—selects between reference clock and data; JDATA 403—jittered data input stream; D2 404—endtapped data from data framing delay lines in DLINES; D1IN 405—centertapped data from data framing delay lines in DLINES.

Figure 4:
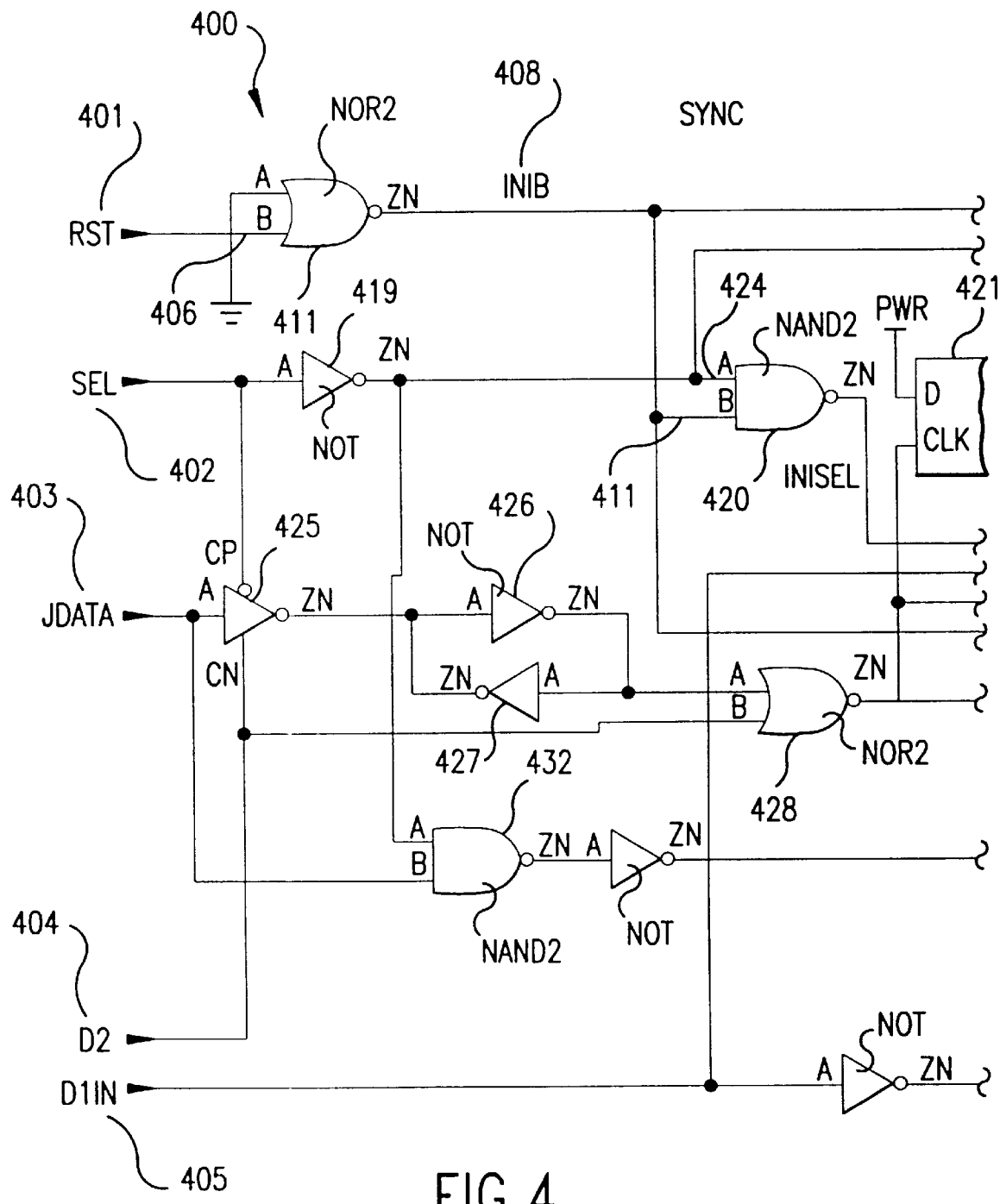
FIGS. 4 and 4a illustrate schematically a synchronization circuit of the phase locked loop of FIG. 1.
Figure 4A:
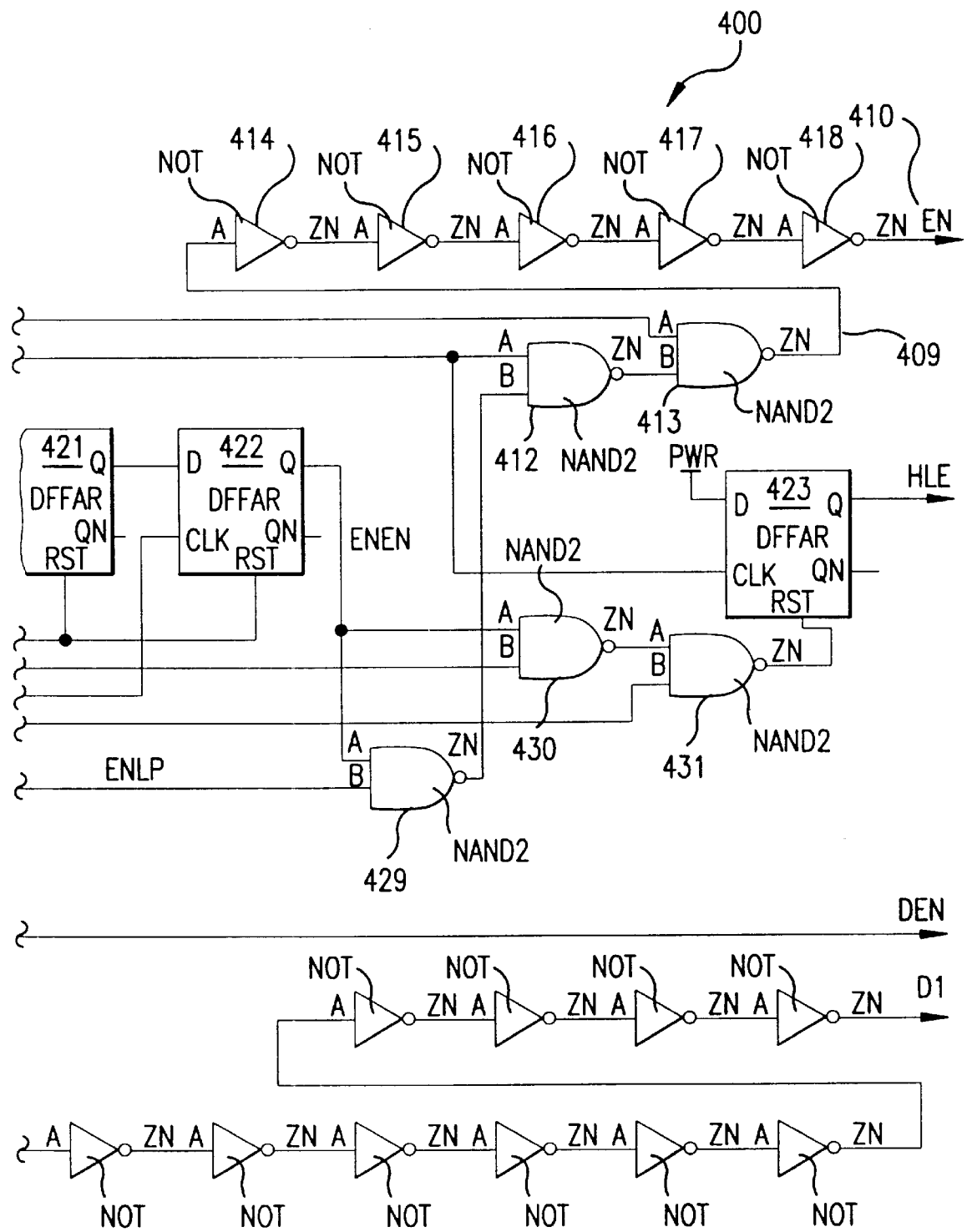

When the internal oscillator clock signal is out of lock to the reference oscillator, synchronization to data is advantageously postponed until lock is reestablished. As described in greater detail below, upon receiving a deasserted LOCK input from LKDTRC, the INIT block generates an RST 401 pulse. As illustrated in FIGS. 4 and 4a, SYNC 400 receives the RST 401 pulse from the INIT block. When this RST 401 pulse is received, the B 406 input to NOR gate 411 is set high thereby forcing INIB 408 low. INIB 408 low is applied to NAND gate 413. This in turn forces its output ZN 409 high. After passing through five inverters 414–418, EN 410 is set low. EN 410 is applied both to LINCTL and LKDTRC. As described in greater detail below, low EN 410 essentially disables LINCTL and LKDTRC. Thus, synchronization is properly postponed while lock is being reestablished. INIB 408 low also resets the two D-latches 421 and 422.

When the internal oscillator is locked, RST 401 remains low. As a result, INIB 408 high will not drive EN 410 to disable LINCTL and LKDTRC and will not reset D-latches 421 and 422.

The present invention further includes ANALOG detect circuitry (not shown) that determines that there is data present. A signal SEL 402 is generated to notify the apparatus to begin data recovery. In the present configuration, SEL 402 low indicated the presence of data. As illustrated in FIG. 4, SYNC 400 receives this SEL 402 signal. When SEL 402 is high (no data), the A inputs to NAND gates 412, 420, and 431 are driven low by inverter 419. As a result of the A input to NAND gate 431 being driven low, DEN is driven low. As a result of the A input to NAND gate 412 being driven low, a logical high is applied to the B input to NAND gate 413. Unless a RST 401 pulse is received from INIT, the output of NAND gate 413 is driven low. After passing through five inverters 414–418, EN 410 is set high. EN 410 high enables both to LINCTL and LKDTRC. (Phase-frequency comparison and lock detection continues on the internal oscillator and reference clock.)

As a result of the A input to NAND gate 420 being driven low, the ZN output of NAND gate 420 is driven high, thereby resetting D-latches 421 and 422. Upon the reset of D-latch 422, Q output applies a logical low to the A input to NAND gate 430. The output ZN of NAND gate 430 then applies a logical high to the A input of NAND gate 431. Similarly, unless a RST 401 pulse is received from INIT, NOR gate 411 also applies a logical high INIB to the B input to NAND gate 431. Both inputs to NAND gate 431 having been set high, the output of NAND gate 431 is set low, clearing the RESET of D-latch 423. This D-latch relates to the zero phase start discussed below.

When the ANALOG detect circuitry (not shown) determines that there is data present, it applies a logical low to signal SEL 402 to notify the apparatus to begin data recovery. The apparatus then looks for two consecutive falling edges of incoming data. This is achieved primarily with D-latches 421 and 422. When SEL 402 is low, the A input to NAND gate 420 is driven high by inverter 419. Similarly, unless a RST 401 pulse is received from INIT, NOR gate 411 applies a logical high signal to the B input to NAND gate 420. Both inputs to NAND gate 420 being set high, its output is driven low, thereby releasing the resets of D-latches 421 and 422. Inverted incoming data on JDATA 403 acts as the clock signal to D-latches. JDATA 403 is the data input stream coming from TSTCTL 800. JDATA 403 is applied to the CLK inputs of D-latches 421 and 422. After two consecutive falling edges of data, the Q output of D-latch 422 goes high. This establishes that valid incoming data is being received.

An 8 nanosecond enable window timed off falling edges of JDATA 403 for detection of correlation error is created. JDATA 403 and D2 applied to NOR gate 428 provide the timing information to create the 8 nanosecond enable window. As described in connection DLINES, D2 is an inverted version of JDATA 403 delayed by 8 nanoseconds. Upon the occurrence of a valid falling edge of data on JDATA 403, NOR gate 428 will cause through NAND gates 429, 412, 413 and inverters 414, 415, 416, 417, 418 the opening of the 8 nanosecond enable window. The window will close after 8 nanoseconds as a result of D2 going high after the initial falling edge of JDATA propagates through the 8 nanosecond bit framing in DLINES and returns on D2.

Having created this 8 nanosecond enable window which is timed off a valid falling edge of data on JDATA 403, phase error correlation between incoming data relative to the internal clock is accomplished. The present invention takes advantage of its knowledge that after it encounters a valid falling edge of data on JDATA 403, it will have access to that data again in 4 nanoseconds on the center tap D1IN 405 of DLINES. In this way, the present invention advantageously anticipates the presence of incoming data, thereby avoiding the difficulty of instantaneous correlation of incoming data to the internal clock.

The present invention includes the circuitry to, under all cases of jitter consideration, ensure the delay line will always produce a window that is never reduced or expanded beyond the 8 nanosecond period. New data is prevented from entering the timing circuity until the enable window is self-timed out by D2. This is accomplished by means of tri-state inverter 425. Tri-state inverter 425 is designed so that falling edges of data pass through regardless of the state of enable while rising edges only pass through when the device is enabled—i.e., when the previous data has timed-out. Thus, no rising edges of data are allowed to come into the timing circuit until the last falling edge has gotten out. Suppose data were to transition high before the 8 nanosecond period. "Squeezing" of the 8 nanosecond window is prevented because the data transition high is not allowed to get through until the D2 feedback has enabled tri-state inverter 425.

Further, the present invention utilizes incoming data to flush out DLINES in instances in which new data appears on JDATA 403 before D2 times out. This is accomplished by NAND gate 206 in DLINES. If there is a data transition coming and the previous data is still propagating through DLINES, the output of NAND gate 206 flushes out the previous data from DLINES. This ensures that the circuitry will be able to trigger off the next falling edge of data.

The phase error is then eliminated by averaging. A recovered clock that is timed relative to incoming data is achieved.

The present invention further includes something referred to as "zero phase start." Zero phase start relates to the problem that when you start looking at data, the clock's falling edge and the data's falling edge have no predictable relationship. It is desirable to avoid correlating the error in LINCTL because it might change the frequency. To avoid this problem, a signal called HLD is generated by D-latch 423 in SYNC 400. HLD recognizes that data has come in and attempts to synchronize the DLINE oscillator. In effect, HLD momentarily turns off the DLINE oscillator and synchronizes it such that when it turns back on, the oscillator's first rising edge will correspond to data's rising edge as close as possible. An advantage of the present invention is that all the biases in DLINES have been previously set to run the oscillator at 125 Mhz. Thus, when the oscillator turns back on after HLD goes high, the oscillator will resume running at 125 MHz.

LINEAR CONTROL CIRCUIT

The linear control circuit 500 compares the reference oscillator with the internal oscillator (divided by 5) DIV5 or data edge from the center tap D1IN in DLINES with the internal oscillator VCO. This comparison is enabled once the EN input is activated subsequent to the oscillator's delay line calibrating itself to a nominal delay characteristic.

Figure 5:
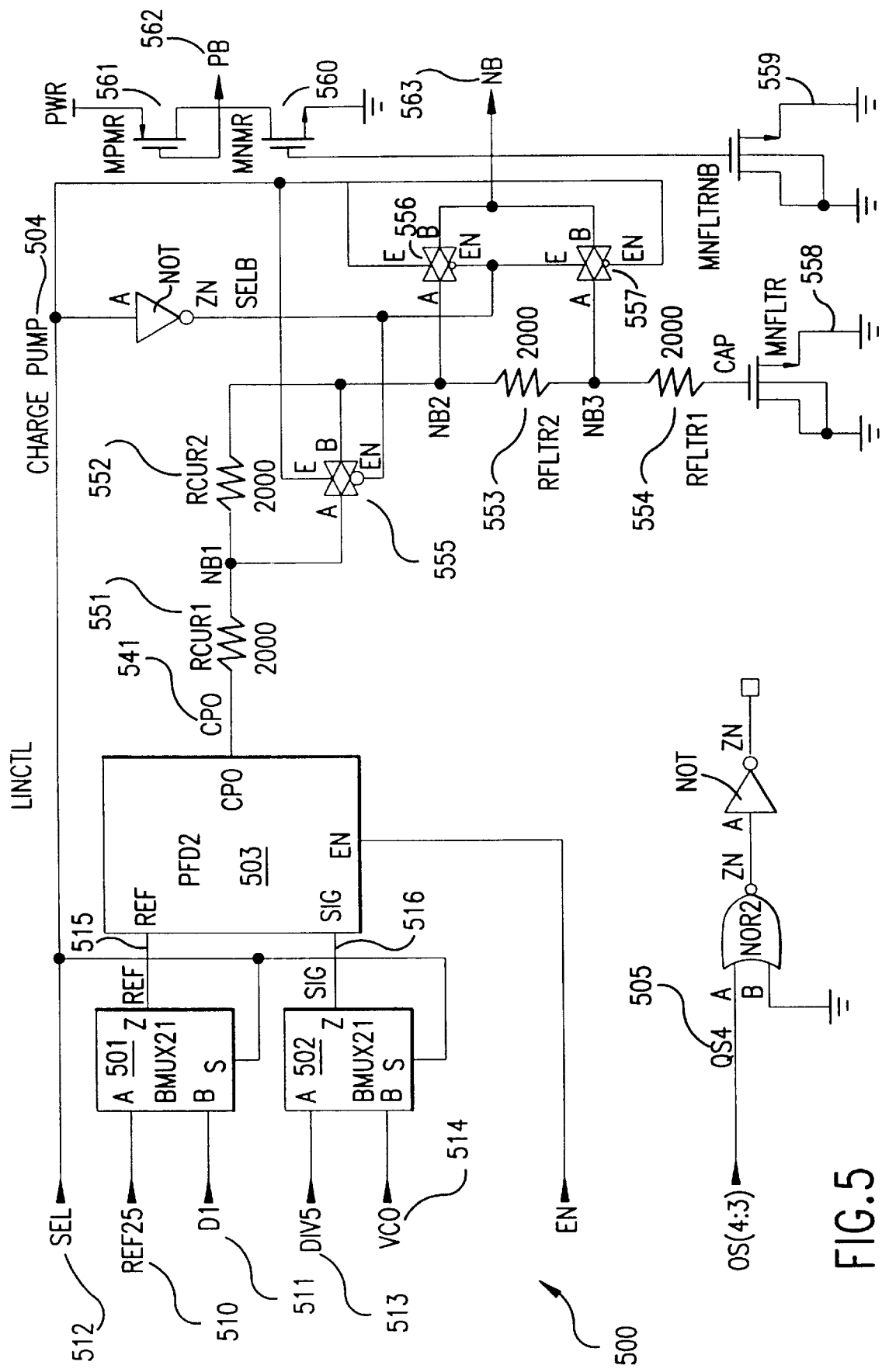
FIGS. 5 and 5a illustrate schematically a phase frequency comparator of the phase locked loop of FIG. 1.

Referring to FIG. 5, the linear control circuit 500 consists of two 2:1 multiplexers 501, 502, a phase-frequency comparator 503 and a charge pump circuit 504. Linear control also includes a gain adjustment circuit 505.

Multiplexer 501 receives two source signals as inputs: REF25 510 from a 25 MHz reference oscillator (not shown) and D1 511 from the SYNC 400. Similarly, multiplexer 502 receives two source signals as inputs: DIV5 513 oscillator signal from the division circuit 900 and VCO 514, the internal oscillator signal from the oscillator and bit framing delay line circuit 300.

Multiplexers 501 and 502 also receive a select signal SEL 512 to select among the two source signals. SEL 512 is generated from an ANALOG detect circuitry (not shown). SEL 512 determines whether the phase-frequency comparator 503 compares REF25 510 with DIV5 513 or compares D1 511 with VCO 514. According to the preferred embodiment of the invention, when select signal SEL 512 is a logical 1, phase-frequency comparator 503 compares REF25 510 with DIV5 513. Alternatively, when select signal SEL 512 is a logical 0, phase-frequency comparator 503 compares D1 511 with VCO 514.

Figure 5A:
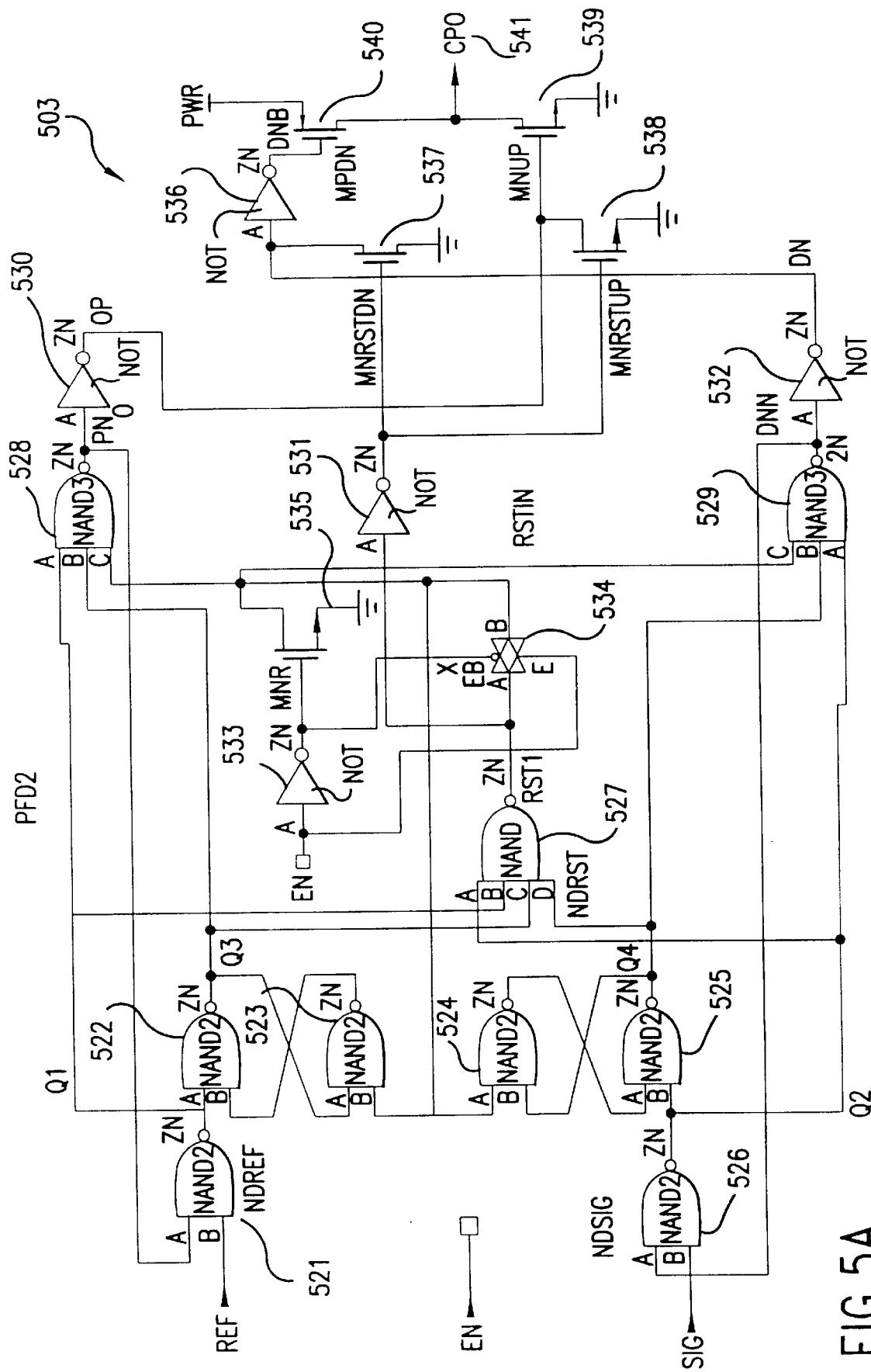

Phase-frequency comparator 503 is shown in FIG. 5a. Phase-frequency comparator 503 includes a flip-flop phase comparator comprising NAND gates 521, 522, 523, 524, 525, 526, 527, 528, and 529, and inverters 531, 532, and 533. The flip-flop phase comparator compares an internal oscillator clock input REF 515 with a reference signal SIG 516. Phase-frequency comparator 503 further includes an enable/disable circuit comprising inverter 533, transmission gate 534, and field effect transistor 535 and an output circuit comprising inverter 536, NMOS field effect transistors 537, 538, and 539 and PMOS field effect transistor 540.

Phase-frequency comparator 503 outputs a signal CPO 541. The phase of output signal CPO 541 is commonly referred to as the phase error. The phase error is representative of the difference between the phase of REF 515 and SIG 516. As illustrated in FIG. 5, comparator output CPO 541 is used to drive a charge pump 504. Charge pump circuit 504 is to convert the output signal CPO 541 of phase-frequency comparator 503 into analog signals suitable for controlling a voltage-controlled oscillator. Reacting to accumulated pulse width modulated inputs coming from the phase-frequency comparator 503, the charge pump 504 generates bias voltages PB 562 and NB 563 for the linear delay stub contained in the oscillator delay line.

Charge pump circuit 504 comprises resistors 551, 552, 553 and 554, transmission gates 555, 556 and 557, field effect transistors 558, 559, 560 and 561 and inverter 562. Preferably, resistors 551, 552, 553 and 554 are 2000 ohm resistors although it is understood that resistor having different values may be employed in alternative embodiments of the invention. Resistors 553 and 554 and transistors 558 and 559 act as a loop filter for the phase lock loop of the present invention. Because the phase-frequency comparator 503 is configurable by select signal SEL 512 to compare either REF25 510 with DIV5 513 or D1 511 with VCO 514, the charge pump is designed so that a different conversion is applied to output signal CPO 541 depending on the configuration.

When select signal SEL 512 is a logical 1 (i.e., phase-frequency comparator 503 is comparing REF 510 with DIV 513), transmission gates 555 and 556 are turned "on" and transmission gate 557 is turned "off", thereby providing a first charge pump path comprising resistor 551, transmission gate 555 and 556 for signal CPO 541 to pass through. Alternatively, when select signal SEL 512 is a logical 0, (i.e., phase-frequency comparator 503 compares D1 511 with VCO 514), transmission gates 555 and 556 are turned "off" and transmission gate 557 is turned "on". In this arrangement, a second charge pump path is provided, comprising resistors 551, 552 and 553 and transmission gate 557.

In an alternative embodiment, loop gain may be process and temperature compensated by using the QS1–QS4 inputs as gain adjust parameters generated in DLINES.

INITIALIZATION CIRCUIT 600

Upon receiving a deasserted LOCK input from LKDTRC, the INIT block generates an RST pulse followed by a single 25 MHz clock pulse (INI) from a continuous CLK input. The INI output calibrates the reference delay (RFLINE) and (DLINE) block and begins the relock cycle. A bit counter in INIT then disables the INIT block for 5.12 microseconds in which time lock should be reestablished and the LOCK signal reasserted.

Figure 6:
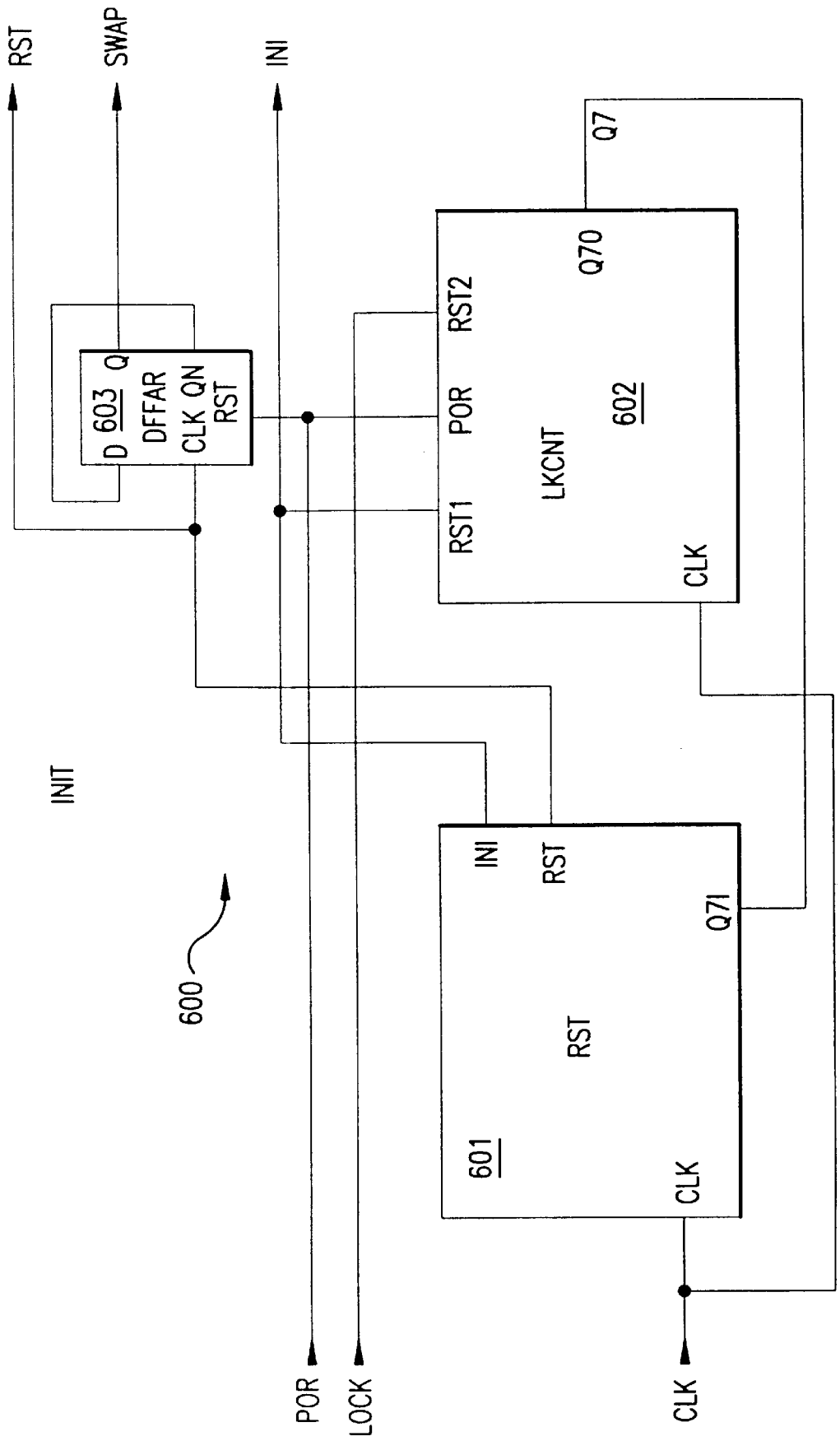
FIGS. 6, 6a and 6b illustrate schematically an initialization circuit of the phase locked loop of FIG. 1.

Referring to FIG. 6, an initialization circuit is shown in accordance with the present invention. Initialization circuit 600 comprises a reset circuit 601, a lock count circuit (LKCNT) 602 and a resettable D-latch 603.

Figure 6A:
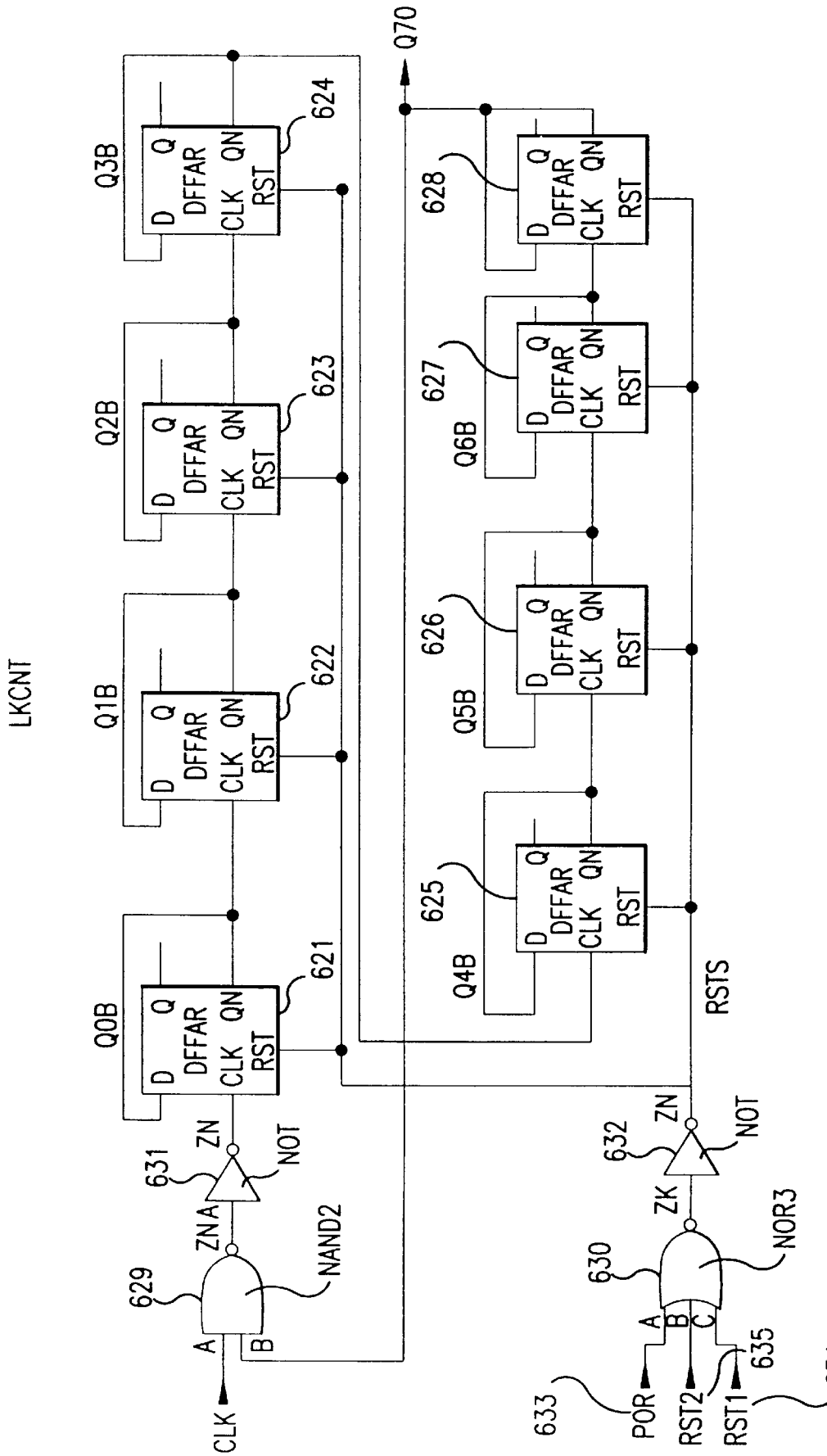

Lock count circuit (LKCNT) 602, illustrated in FIG. 6a, receives a 25 MHz reference clock from the 25 MHz reference oscillator (not shown) and three reset signals, POR, RST1, and RST2. POR is a outside reset signal. RST1 is a reset signal derived from the output INI from the reset circuit described below. RST2 is a reset signal derived from the LOCK signal generated in the LKDTRC block. When one or more of the three reset signals POR, RST1 or RST2 go logically high, INIT is disabled for a predetermined time in which lock should be reestablished and the LOCK signal reasserted. According to a preferred embodiment of the invention, a 5.12 microsecond disable period is utilized. It is well understood that other periods may be employed in alternative embodiments. After the disable, Q70 is asserted.

Figure 6B:
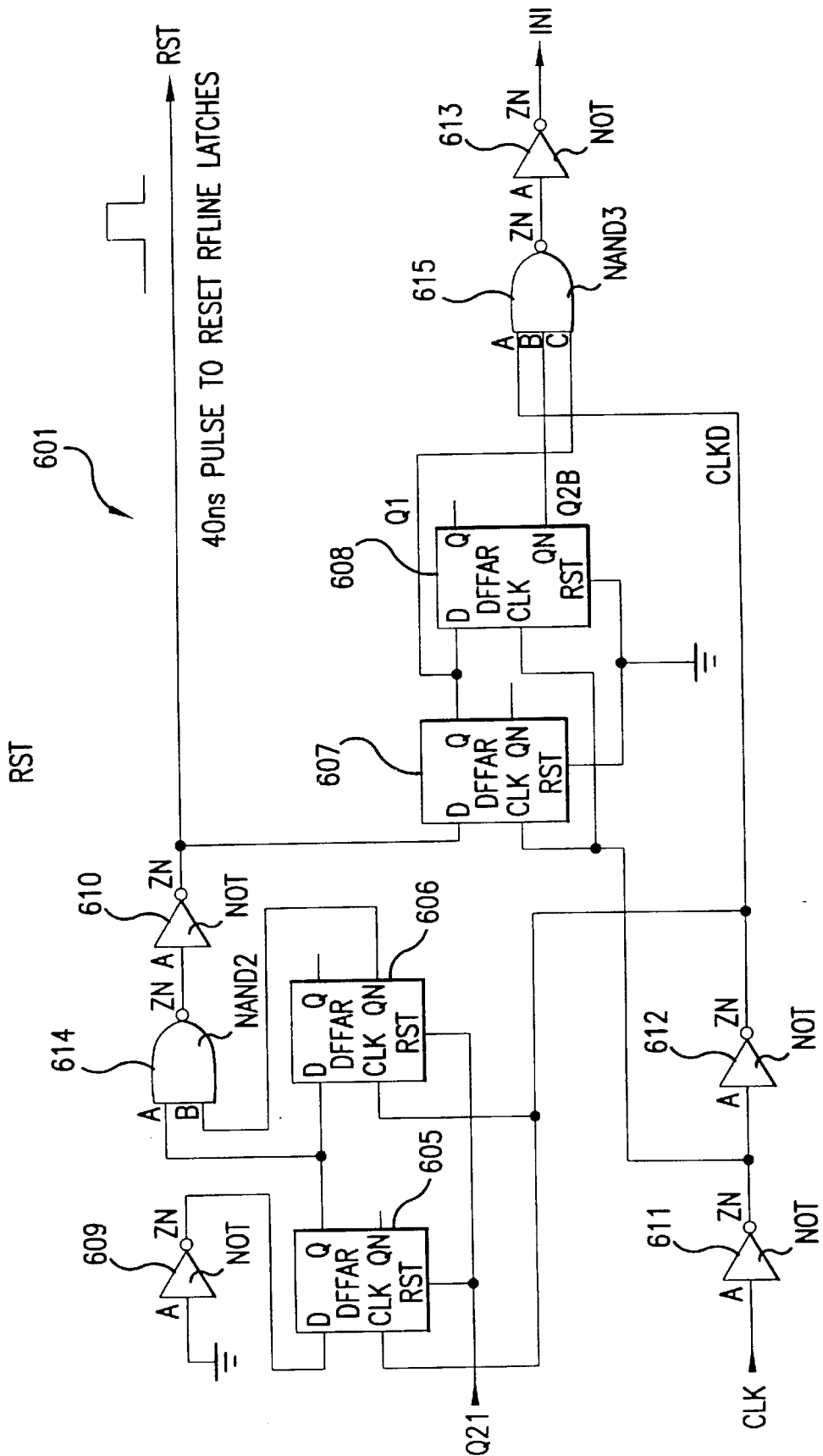

The reset circuit of the initialization circuit 600, illustrated in FIG. 6b, generates a single pulse to reset the reference delay line latches. The signal reset pulse is sent down reset line to reset the reference delay latches of the reference delay line circuit 300. Preferably, the reset pulse sent down the reset is 40 ns in length.

LOCK DETECT

The lock detect circuitry or LKDTRC 700 comprises 2 short delay lines acting as offsets on the inputs to two phase detectors. These offsets simulate maximum and minimum analog delay stub settings. Both lines are process and temperature compensated with QS1–QS4 inputs. Phase comparators compare the 25 MHz REF input to the internal oscillator divided by 5 (DIV5) fed into the SIG input. Phase comparators also determine if the linear delay stub has reached either end of its functional range. This condition deasserts the LOCK output and starts recalibration.

The present invention takes advantage of the fact that by intentionally inserting opposite skews into two signals under test that are expected to be very close in phase to each other, samples are created that when they are compared will yield different answers. For example, suppose two signals are no more than 250 picoseconds out of phase. If an intentional 500 picosecond skew is applied in both directions to the two signals, in one direction the two signals will overlap while in the other directions the two signals diverge. If the result is passed through an exclusive-OR, a 1 indicates strong phase correlation. Contrastly, if the two signals are out of phase by 1000 picoseconds, when the intentional 500 picosecond skew is applied in both directions, in neither direction will overlap be realized. Thus, if the result is passed through an exclusive-OR, a 0 will result indicating poor phase correlation.

To detect lock in data, the present invention utilizes the fact that the clock signal is expected to fall within the 8 nanosecond enable window generated in SYNC and DLINES. Thus, this 8 nanosecond enable window is utilized to detect lock in data. As long as the clock signal falls within that 8 nanosecond enable window and does not come within a predefined distance of the edges of the window, a locked state is determined. When the clock falls within 500 picoseconds of the edge of the window for 2 consecutive times, an out-of-lock state is determined.

Advantageously, the circuit used to detect lock on reference is also used to detect lock on data except the situation described above—i.e., intentional insertion of opposite skews into two signals under test that are expected to be very close in phase to each other creates samples that when they are compared will yield different answers—detect out-of-lock state as opposed to lock state. The clock signal (divided by 2) and the 8 nanosecond enable window are oppositely skewed and applied to the comparators. If a strong phase correlation signal is indicated by the exclusive-OR, an out-of-lock state is detected.

Figure 7:
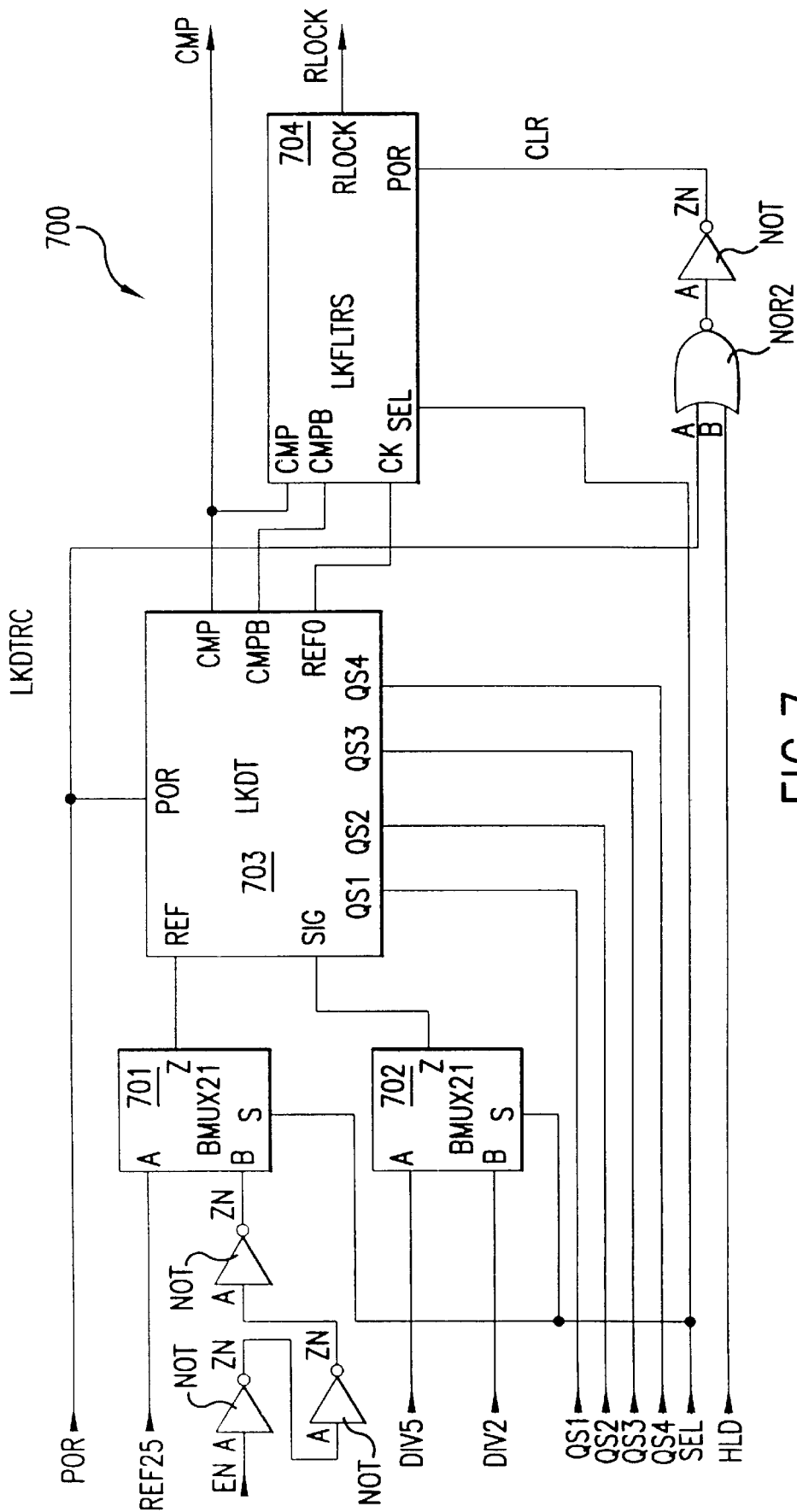
FIGS. 7, 7a, 7b, 7c, 7d, 7e and 7f illustrate schematically a lock detect circuit of the phase locked loop of FIG. 1 and a timing diagram associated therewith.
Figure 7A:
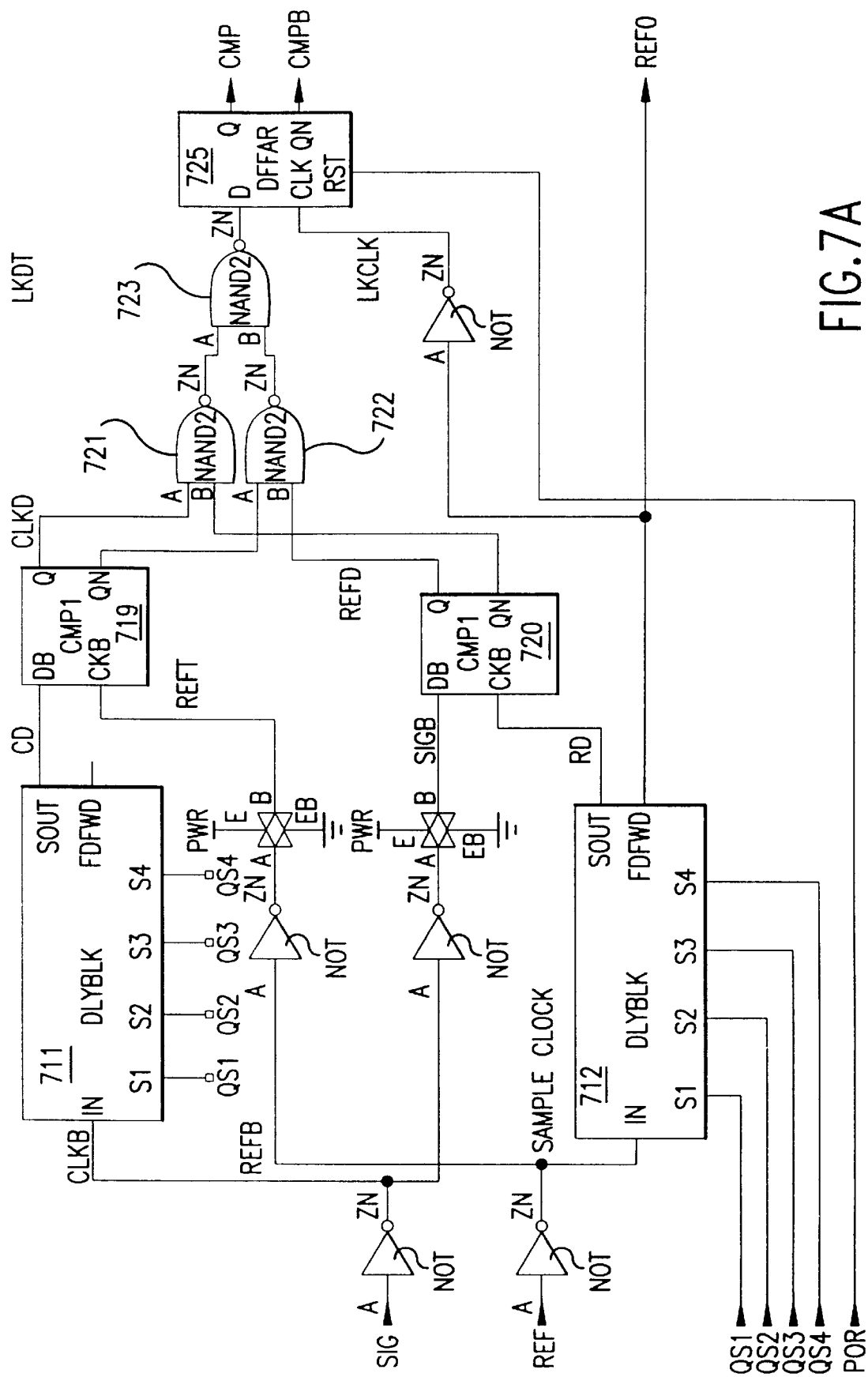
Figure 7B:
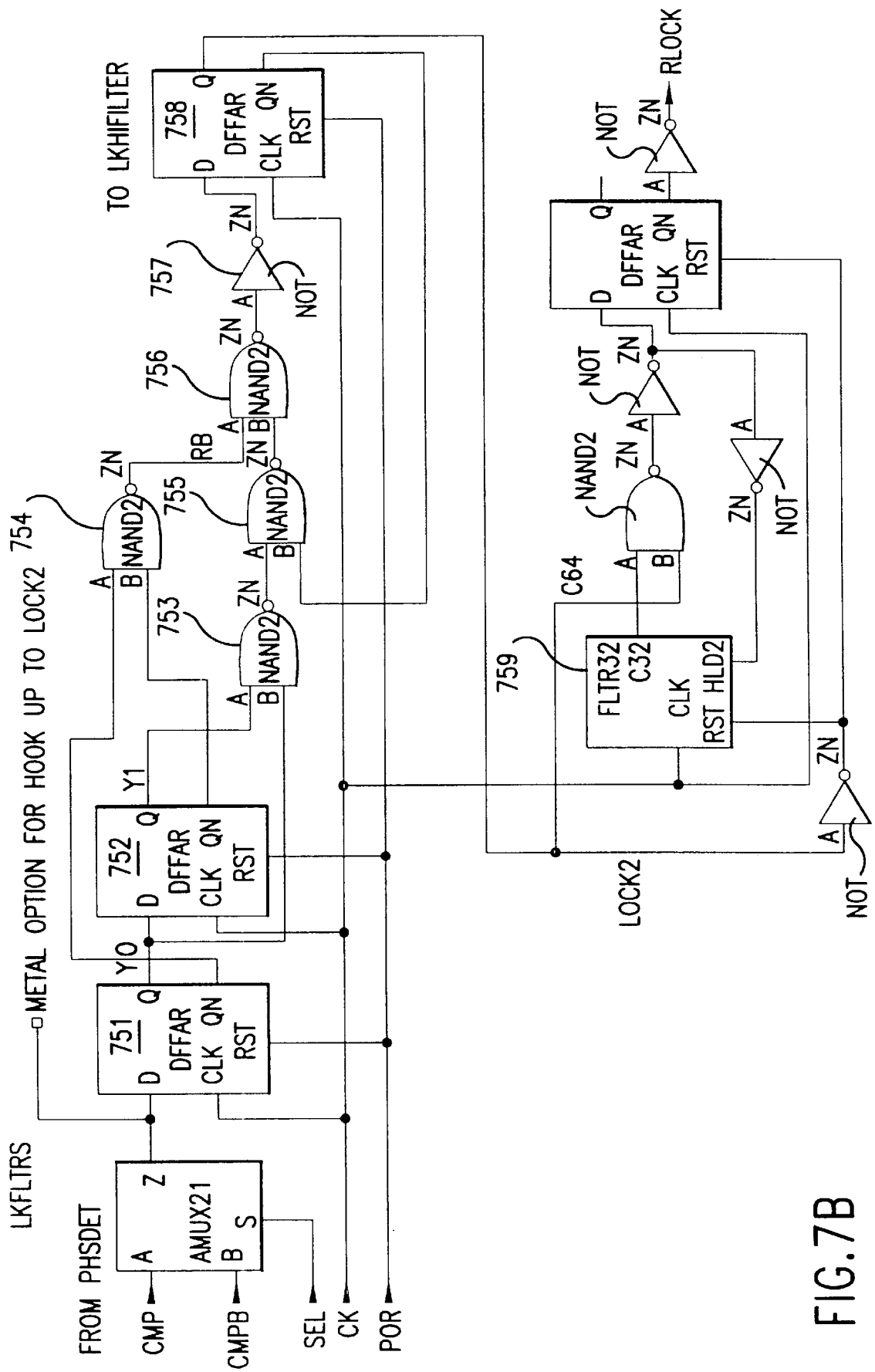
Figure 7C:
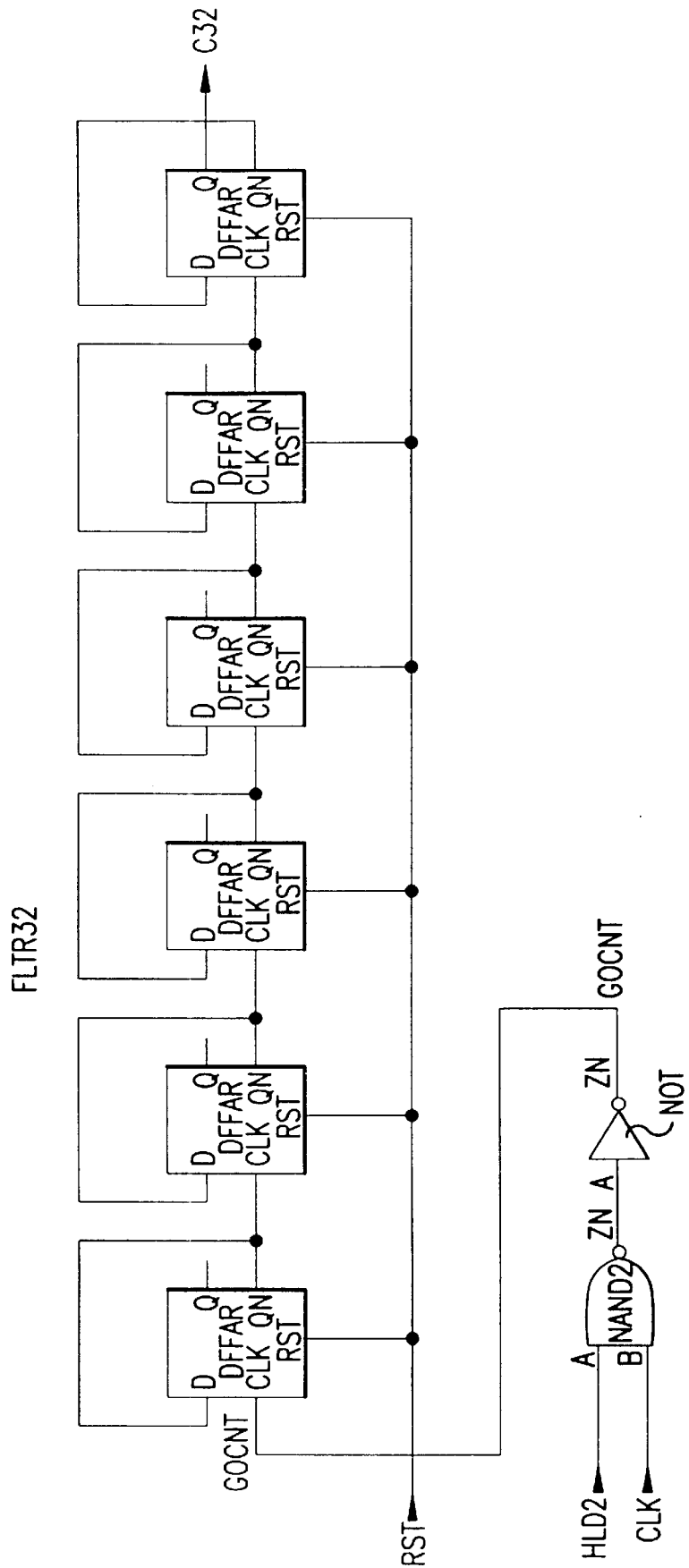
Figure 7F:
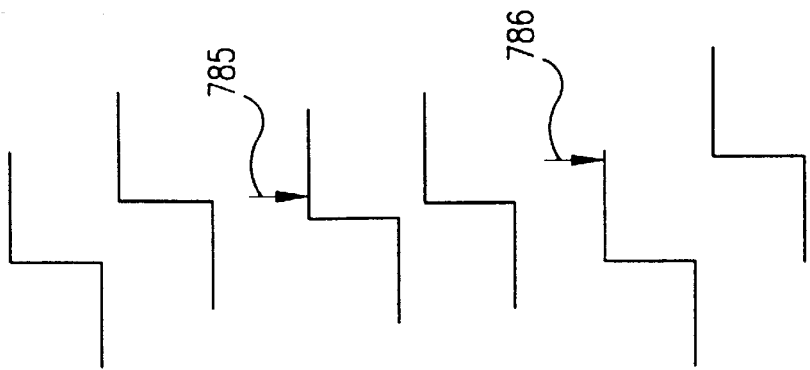

LKDTRC 700 is illustrated in FIGS. 7–7f. LKDTRC 700 comprises two multiplexers 701, 702, LKDT 703, and LKFLTRS 704. Input A of multiplexer 701 is connected to the 25 MHz clock reference. Input A of multiplexer 702 is connected to the 125 MHz internal oscillator by way of DIV5. Input B of multiplexer 701 is connected to the 8 nanosecond enable window signal EN from SYNC and input B of multiplexer 702 is connected to the one-half of the internal oscillator by way of BUF-REG. SEL selects between the A and B inputs of multiplexers 701, 702.

Delay blocks are designed to intentionally skew the incoming signals by a certain amount. The present invention takes advantage of the process and temperature information determined in RELINES. Delay elements are added or subtracted to establish a 500 picosecond delay. Illustrated in FIG. 7a, LKDT 703 comprises delay blocks 711, 712, compare blocks 719, 720, NAND gates 721, 722, 723 and D-latch 725. Delay blocks 711, 712 are illustrated in FIG. 8a. Delay blocks receive a signal on IN and output two delayed signals, FDFWD and SOUT. FDFWD is the signal IN delayed by a predetermined fixed about. In the embodiment illustrated in FIG. 8a, a four inverter delay results in FDFWD. SOUT is the signal IN delayed by a variable amount determined by quadrant process and temperature indicators QS1–QS4. If QS1 or QS2 is asserted, a three inverter delay is imposed on IN to result in SOUT. If QS3, QS4 or NOR quadrant indicator is asserted, a five inverter delay is imposed on IN to result in SOUT.

Figure 7E:
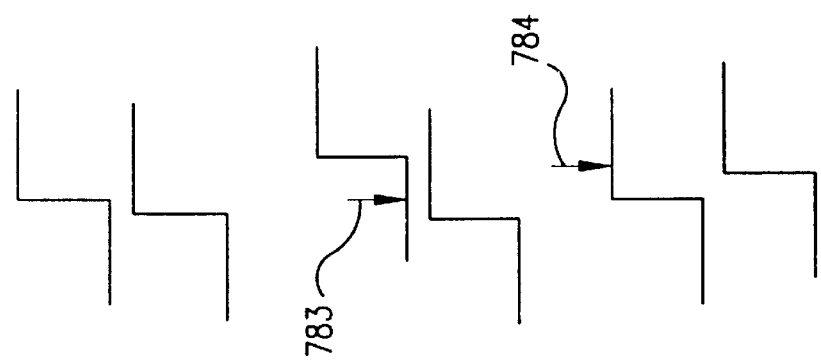
Figure 7D:
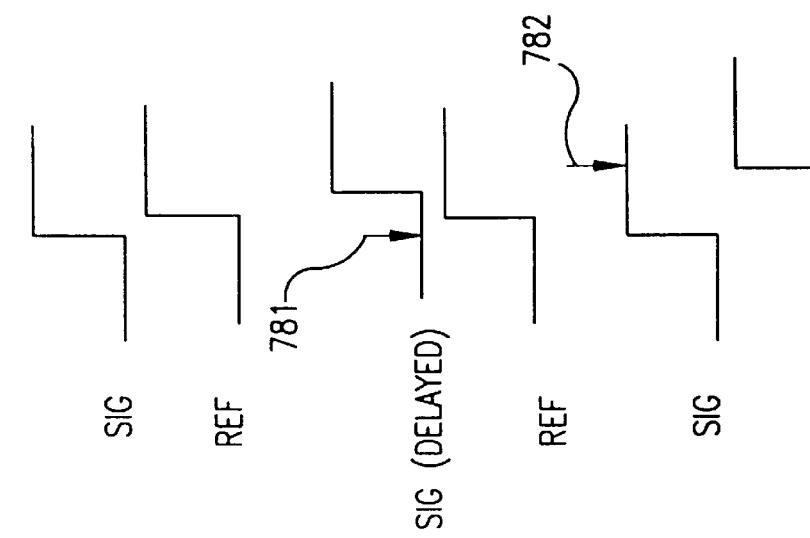

Compare block 719 is designed to compare a delay version of SIG (SOUT of delay block 713) with REF. Compare block 720 is designed to compare a delayed version of REF (SOUT of delay block 718) with SIG. The operation of compare blocks 719 and 720 is illustrated in FIG. 7d–7f. Timing diagram of FIG. 7d illustrates the situation in which SIG trails REF within an acceptable margin of lock. Arrow 781 indicates a "0" sample of SIG at the rising edge of REF(DELAYED). Arrow 782 indicates a "1" sample of SIG(DELAYED) at the rising edge of REF. Similarly, timing diagram of FIG. 7e illustrates the situation in which SIG leads REF within an acceptable margin of lock. Arrow 783 indicates a "1" sample of SIG at the rising edge of REF(DELAYED). Arrow 784 indicates a "0" sample of SIG(DELAYED) at the rising edge of REF. In both cases, the different sampling results indicate strong phase correlation.

In contrast, timing diagram of FIG. 7f illustrates an out-of-lock situation. Arrows 785 and 786 both sample a "1" thus indicating a poor phase correlation.

LKDTRC 700 looks for 32 consecutive samples where the phase error is at or below the threshold. Upon observation of 32 consecutive samples at or below this phase error threshold, LKDTRC 700 assumes the signals are stabilized and sends an RLOCK signal. This is achieved by the 32 bit counter 768. To avoid coming out of lock upon detection of a mere glitch in the signal, such as noise, LKDTRC 700 advantageously must detect two consecutive samples out of lock before popping out of lock and start the 32 consecutive sample cycle over again. As illustrated in FIG. 7b, this is achieved by D-latches 751, 752, 758, NAND gates 753, 754, 755, 756 and inverter 757. FLTR32 is illustrated in FIG. 7c.

TEST CONTROL 800

The test control circuit 800 is a test fixture which in test mode selected by TSTJIT 807 will produce a jittered version of DATAIN 806 for jitter tolerance test. The output JDATA 808 is either a jittered or uncorrupted version of DATAIN 806 depending on TSTJIT 807 value. If in test mode, test control circuit 800 forces the circuitry to think that the data is bad and see how well the apparatus recovers that data. If data is recoverable in test mode, there is a good indication that data will be recoverable in normal operation.

Figure 8:
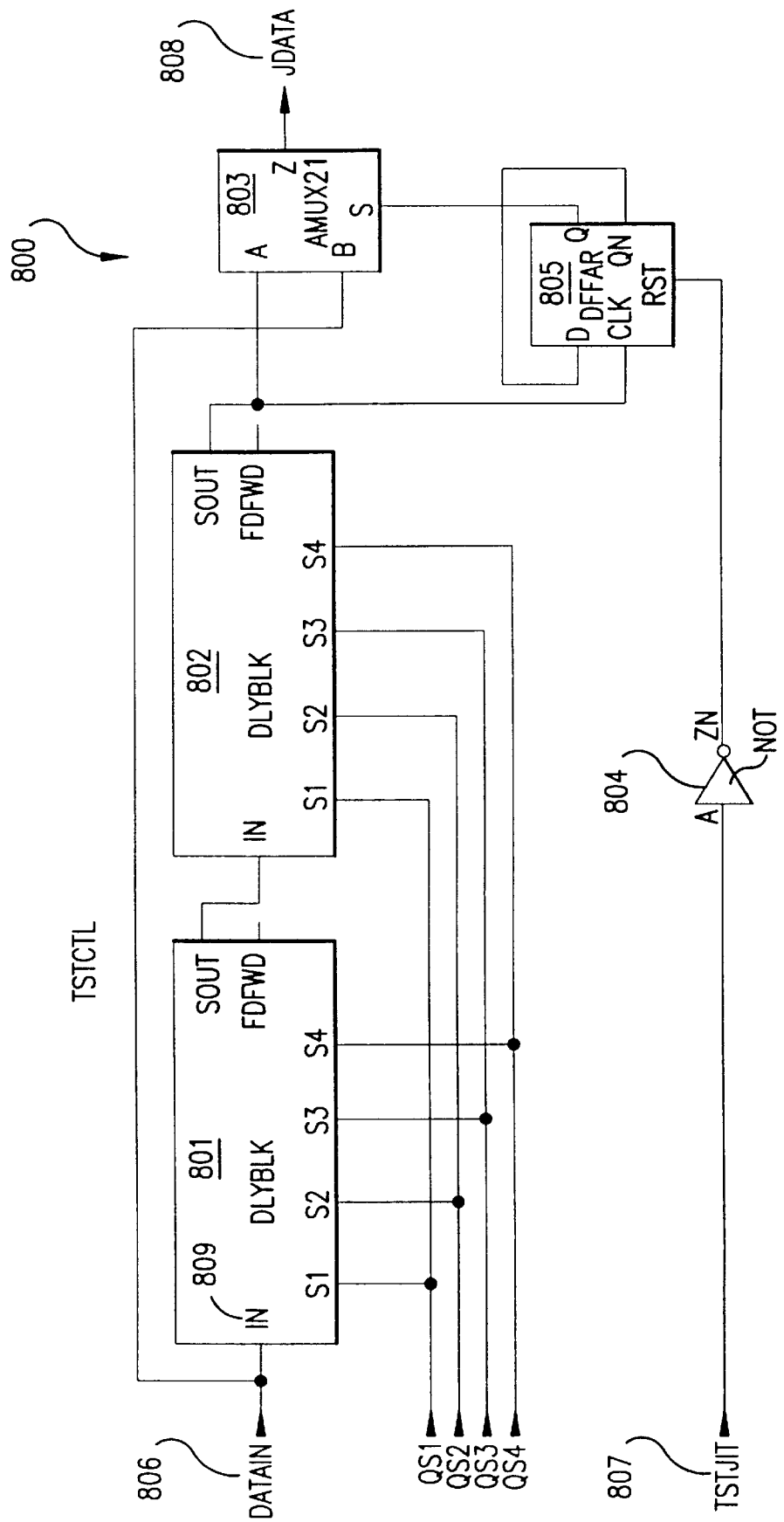
FIGS. 8, 8a and 8b illustrate schematically a test control circuit of the phase locked loop of FIG. 1.
Figure 8A:
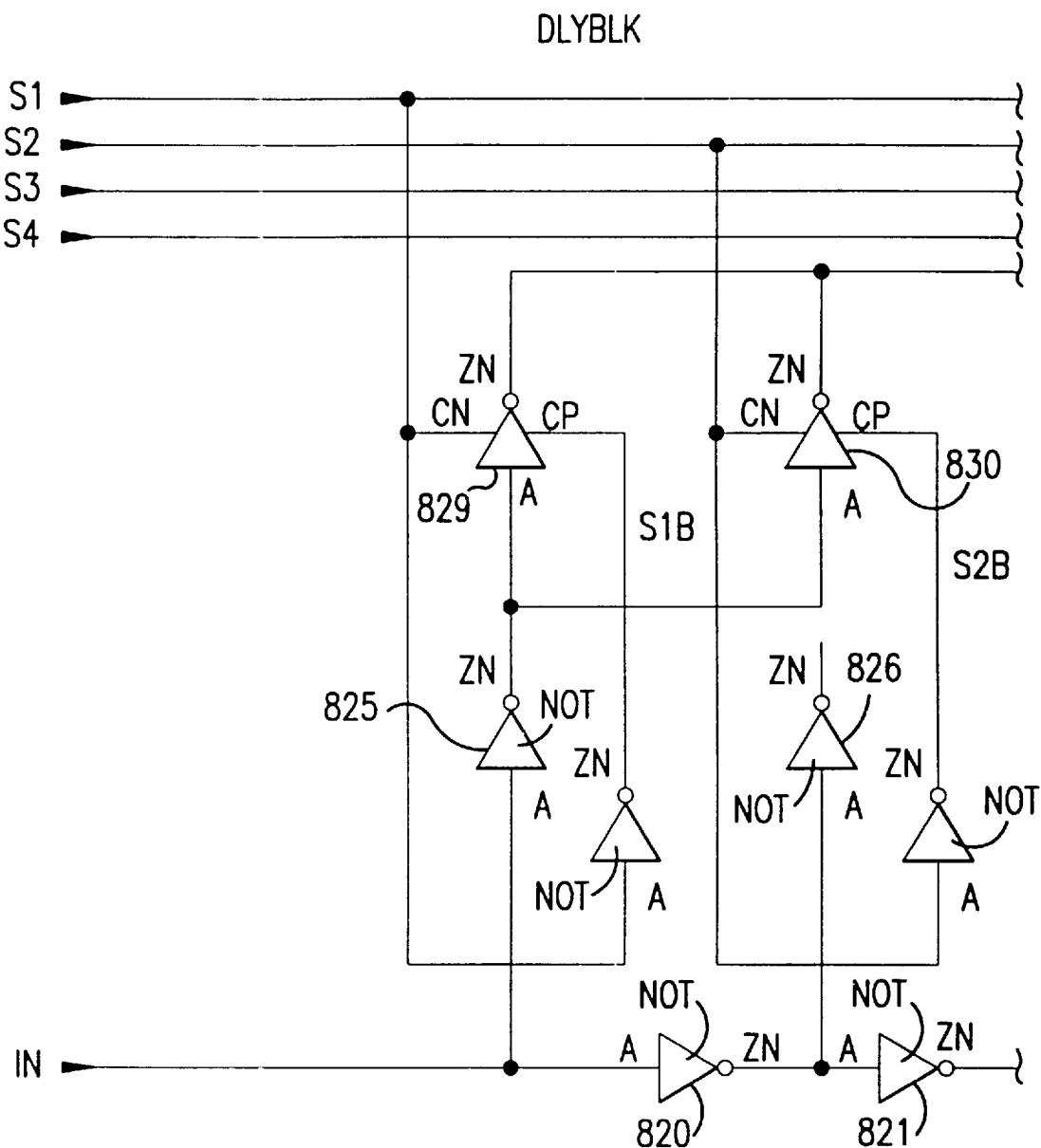

As illustrated in FIG. 8, the test control circuit comprises a first and second delay block 801 and 802, a 2:1 multiplexer 803, an inverter 804 and a D-latch 805. Test control circuit 800 receives the data stream DATAIN 806 onto which the phase-lock loop of the present invention is designed to lock. Test control circuit 800 also receives quantrant indicator signals QS1–QS4 generated by DLINES as process and temperature compensation and a select signal TSTJIT 807.

The test control circuit 800 is designed such that when TSTJIT 807 is at logic HIGH, the test control block 800 outputs an uncorrupted version of DATA on JDATA 808. This is accomplished by routing DATAIN 806 directly into the multiplexer 803, thereby avoiding the imposition of jitter onto the input signal DATAIN 806 by the first and second delay blocks 801 and 802. TSTJIT 807 is inverted by inverter 804 and applied to RST of D-latch 805. As a result, Q output of D-latch 805 is reset to logic LOW, thereby passing the B input of multiplexer 803 onto JDATA 808.

When TSTJIT 807 goes to a logic HIGH, the test control circuit 800 outputs a jittered version of DATAIN 806. The jittered or uncorrupted version of DATAIN 806 is output as JDATA 808. When TSTJIT 807 goes HIGH, the RST of D-latch 805 will go LOW. On the next CLK edge, the D-latch 805 will set Q HIGH, thereby passing the A input of multiplexer 803 onto JDATA 808.

Figure 8B:
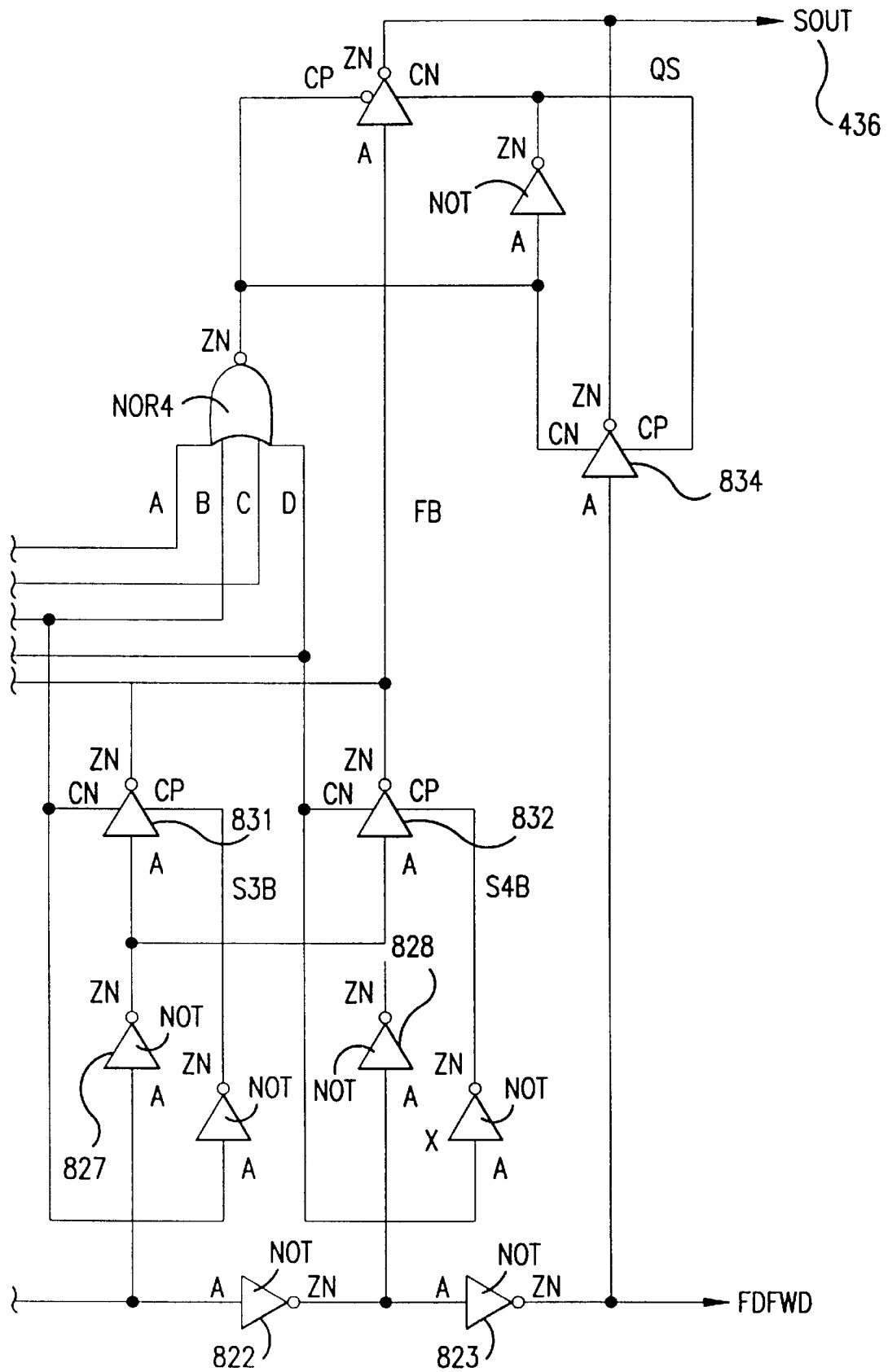

The first and second delay block impose a jitter onto the input signal DATAIN 806. Generally speaking, the first and second delay blocks impose a process and temperature compensated delay onto DATAIN 806. This delayed signal is output from the second delay block and fed into the second input of multiplexer 803. As illustrated in FIGS. 8a and 8b, the first and second delay blocks 801 and 802 comprise generally a plurality of inverters and a NOR gate. The delay blocks receive an input signal IN 809 and pass that signal through a plurality of delay elements to delay the signal a predetermined amount. In the preferred embodiment, each delay element comprises an inverter which imposes a delay on the signal. It is appreciated to one skilled in the art that alternative delay elements are contemplated by the present invention.

The delay blocks also receive quantrant indicator signals QS1–QS4 generated by DLINES as process and temperature compensation. If none of the quantrant indicator signals QS1–QS4 have been set by DLINES, the input signal IN 809 passes through four inverters 820, 821, 822, 823 and tri-state inverter 834 and is output on SOUT 836. If QS1 is set, the input signal IN 809 passes through inverter 825 and tri-state inverters 829 and 833. Similarly, if QS2 is set, the input signal IN 809 passes through inverter 825 and tri-state inverters 830 and 833. If QS3 is set, the input signal IN passes through inverters 820, 821, and 827 and tri-state inverters 831 and 833. Similar to QS3, when QS4 is set, the input signal IN 809 passes through inverters 820, 821, and 827 and tri-state inverters 832 and 833.

DIVIDE5 900 and BUF_REG 901

Figure 9A:
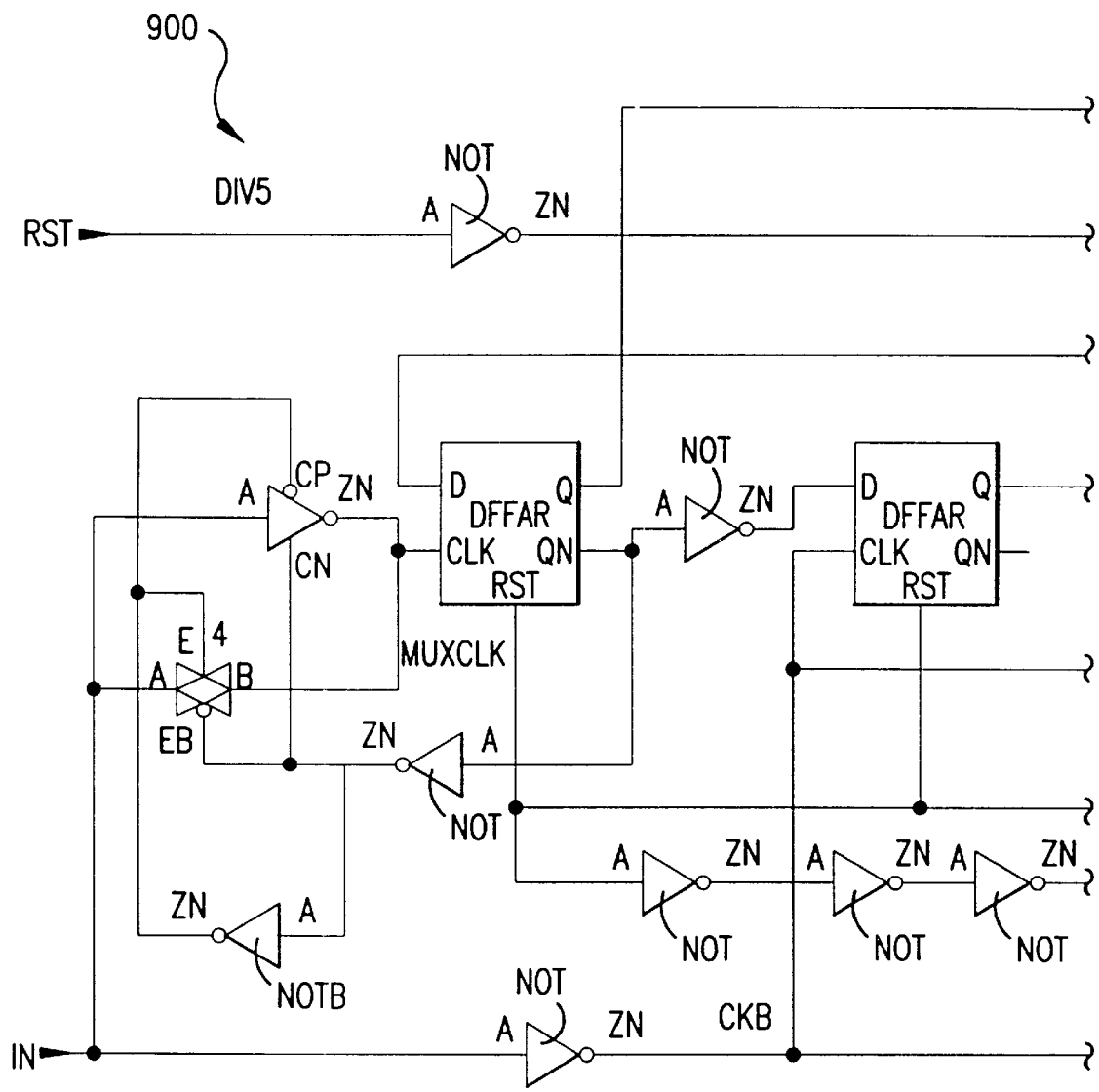
FIGS. 9a, 9b and 9c illustrate schematically division circuits of the phase locked loop of FIG. 1.
Figure 9B:
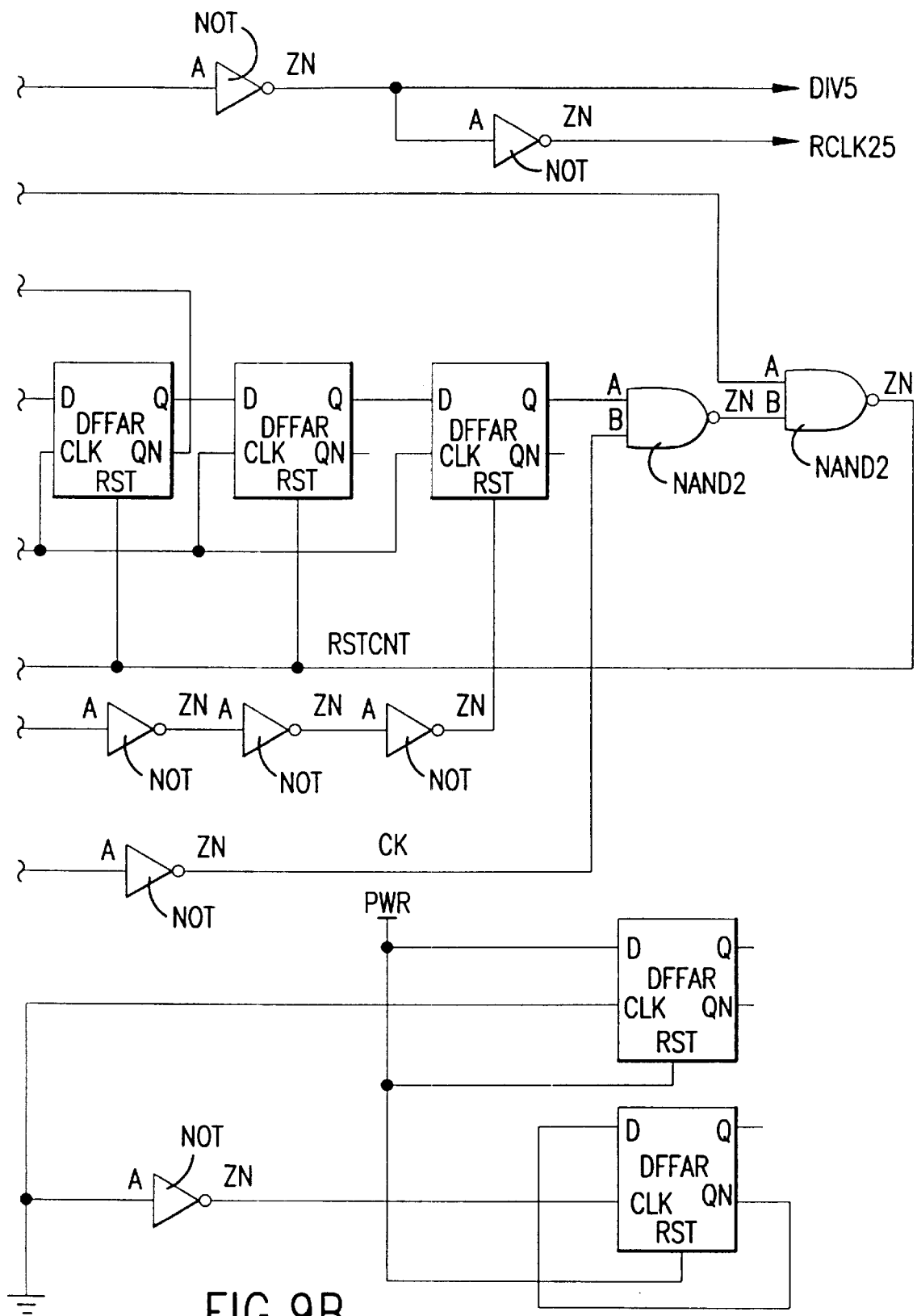
Figure 9C:
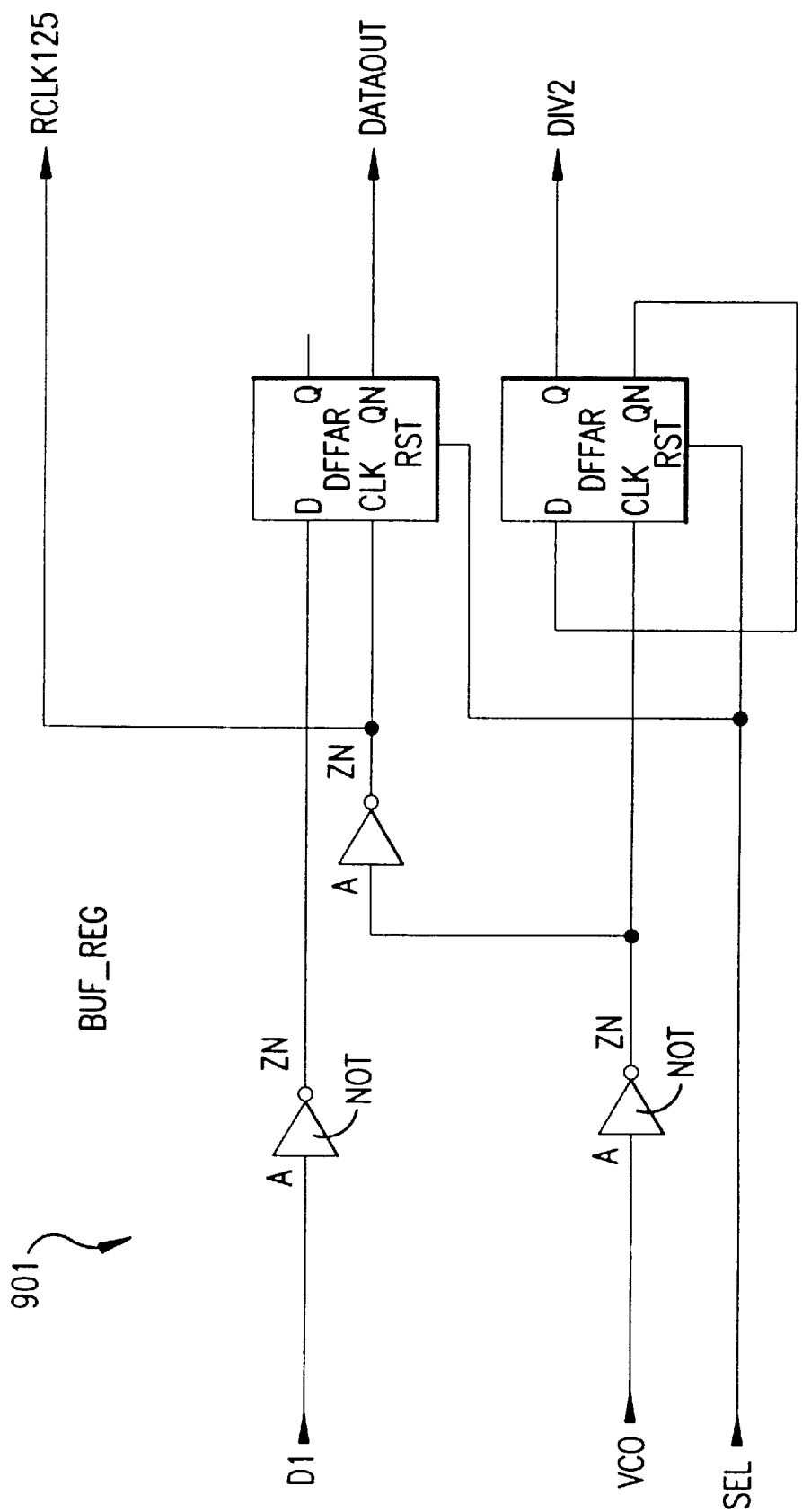

DIVIDE5 900, illustrated in FIGS. 9a and 9b, is design to divide the internal oscillator clock signal by 5. BUF_REG 901, illustrated in FIG. 9c, is designed to divide the internal oscillator clock signal in half.

It should be appreciated by those skilled in the art that the specific embodiments disclosed above may be readily utilized as a basis for modifying or designing other structures for carrying out the same purposes of the present invention. For example, locking at frequencies higher or lower than 125 Mhz are within the ambit of the present invention. It should also be realized by those skilled in the art that such equivalent constructions do not depart from the spirit and scope of the invention as set forth in the appended claims.

What is claimed is:

1. In a phase-locked loop, an apparatus for calibrating a delay line comprising:
    a delay line having one or more delays capable of being selected to generate a desired oscillation;
    a reference delay line having a plurality of delay elements connected in series;
    a clock circuit capable of propagating a clock signal of known duration T through the reference delay line; and
    a selection circuit capable of selecting one or more of the selectable delays in the delay line corresponding to the delay elements of the reference delay line through which the clock signal propagates in time T.

2. An apparatus as in claim 1, wherein a plurality of the delay elements in the reference delay line have an output capable of being set and reset and wherein the apparatus further comprises:
    means operable for the duration of the clock signal for setting the output of the delay elements through which the clock signal propagates; and
    means for resetting the outputs of previously set delay elements.

3. An apparatus as in claim 1, further comprising means for adjusting the amount of delay in the reference delay line.

4. In a phase-locked loop, a method for calibrating a delay line having one or more delays capable of being selected to generate a desired oscillation using a reference delay line having a plurality of delay elements connected in series, each of the delay elements having an output capable of being set and reset, and a clock signal of known duration, comprising the steps of:
    propagating the clock signal through the reference delay line;
    setting the output of the delay elements that the propagating clock signal reaches prior to the clock signal timing out;
    resetting the output of the previously set delay elements; and
    selecting the delay in the delay line corresponding to the last set delay element of the reference delay line.

5. A method as in claim 4, further comprising the step of adjusting the amount of delay in the reference delay line.

6. In a phase-locked loop, an oscillator comprising:
    a signal indicative of the distance that a clock signal of known duration propagates through a series of delay elements;
    a plurality of loops, a plurality of the loops each having an inverter and a unique delay; and
    a selection circuit responsive to the signal capable of selecting the loop having a delay corresponding to the amount of delay appropriate to generate a desired frequency.

7. An apparatus as in claim 6 further including means for initially setting the oscillator to oscillate at a frequency faster than a target frequency and means for applying an analog adjustment to the oscillator to tune the oscillator to the target frequency.

8. An apparatus as in claim 6, further comprising an analog adjustment capable of being applied to the selected loop.

9. In a phase-locked loop, a method for generating an oscillator cycling at a frequency on one of a plurality of loops, a plurality of the loops having an inverter and a unique delay, comprising the steps of:
    determining the delay appropriate to generate the frequency by propagating a clock signal of known duration through a series of delay elements; and selecting the loop having a delay corresponding to the distance the clock signal propagates through the delay elements to generate the frequency.

10. A method as in claim 9, further comprising the step of initially setting the oscillator to oscillate at a frequency faster than the target frequency and subsequently applying an analog adjustment to the oscillator to tune the oscillator to the target frequency.

11. A method as in claim 9, further comprising the step of applying an analog adjustment to the selected loop.

12. In a phase-locked loop, an apparatus for synchronizing a clock signal to data, comprising:

a comparator capable of comparing a clock signal and data and outputting a third signal corresponding to the comparison of the data and clock signal, the comparator having an enable;

a detection circuit for detecting the presence of data, the detection circuit sending a signal to enable the comparator upon the detection of data;

a first delay circuit for delaying data, the first delay circuit sending delayed data to the comparator for comparison with the clock signal; and a second delay circuit, the second delay circuit sending delayed data to disable the comparator.

13. An apparatus as in claim 12, wherein the clock signal is at a first frequency and the data is at a frequency which is one-half the first frequency.

14. In a phase-locked loop, a method for synchronizing a clock signal to data, comprising the steps of:

enabling a comparator upon the detection of data;

comparing a phase difference between an edge of the clock signal with an edge of a first delayed version of the data generated by a first delay circuit;

adjusting the clock signal to reduce the phase difference; and disabling the comparator after the data passes through a second delay circuit.

15. In a phase-locked loop, an apparatus for detecting phase synchronization of a first and second signal, comprising:

a first delay circuit for skewing the timing of the first signal in a first direction with respect to the second signal;

a second delay circuit for skewing the timing of the first signal in a second direction with respect to the second signal; and a comparison circuit for comparing an edge of the second signal with the corresponding edge of the first signal skewed in the first direction and with the corresponding edge of the first signal skewed in the second direction.

16. In a phase-locked loop, a method for detecting phase synchronization of a first and second signal, comprising:

skewing the timing of the first signal in a first direction with respect to the second signal;

skewing the timing of the first signal in a second direction with respect to the second signal; and comparing an edge of the second signal with the corresponding edge of the first signal skewed in the first direction and with the corresponding edge of the first signal skewed in the second direction.

17. In a phase-locked loop, an apparatus for detecting phase synchronization of a first and second signal, comprising:

a first delay circuit for skewing the timing of the first signal in a first direction;

a second delay circuit for skewing the timing of the second signal in the first direction;

a sampling circuit for sampling the skewed first signal at an edge of the second signal;

a sampling circuit for sampling the skewed second signal at an edge of the first signal; and a comparator to compare the samples to detect phase synchronization of the first and second signals.

18. In a phase-locked loop, a method for detecting phase synchronization of a first and second signal, comprising:

skewing the timing of the first signal in a first direction;

skewing the timing of the second signal in the first direction; and sampling the skewed first signal at an edge of the second signal;

sampling the first signal at an edge of the skewed second signal; and comparing the samples to detect phase synchronization of the first and second signals.

* * * * *